US012652941B2

(12) United States Patent
Lee et al.

(10) Patent No.: US 12,652,941 B2
(45) Date of Patent: Jun. 9, 2026

(54) DISPLAY DEVICE AND METHOD OF MANUFACTURING THE SAME

(71) Applicant: Samsung Display Co., LTD., Yongin-si (KR)

(72) Inventors: Sangduk Lee, Yongin-si (KR); Hoikwan Lee, Yongin-si (KR); Ho Yun Byun, Yongin-si (KR); Eun-Kyung Yeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 384 days.

(21) Appl. No.: 18/524,932

(22) Filed: Nov. 30, 2023

(65) Prior Publication Data

US 2024/0306480 A1 Sep. 12, 2024

(30) Foreign Application Priority Data

Mar. 10, 2023 (KR) ........................ 10-2023-0031541

(51) Int. Cl.
H10K 59/80 (2023.01)
H05K 1/189 (2026.01)
(Continued)

(52) U.S. Cl.
CPC ......... H10K 59/8793 (2023.02); H05K 1/189 (2013.01); H10K 59/40 (2023.02);
(Continued)

(58) Field of Classification Search
CPC .... H10K 59/8793; H10K 1/189; H10K 59/40; H10K 59/8792; H10K 71/00; H10K 2201/10128; H10K 2102/311; H10K 50/86; H10K 77/111; H10K 59/8791; H10K 59/1201; H10K 59/872
See application file for complete search history.

(56) References Cited

U.S. PATENT DOCUMENTS 10,270,064 B2 * 4/2019 Kim ................... H10K 59/8791
10,319,939 B2 6/2019 Seong et al.
(Continued)

FOREIGN PATENT DOCUMENTS

KR 100129499 B1 4/1998
KR 20180098445 A 9/2018
(Continued)

*Primary Examiner* — Douglas W Owens
(74) *Attorney, Agent, or Firm* — CANTOR COLBURN LLP

(57) ABSTRACT

A display device includes a display panel having a non-bending area and a bending area extending from an end of the non-bending area, wherein the display panel includes a display panel bendable portion, a bending protective layer disposed on the display panel and including a bending protective layer bent portion being bendable with the bending area, a polarization unit disposed on the display panel, partially disposed on the bending protective layer, and defining a step difference which corresponds to the bending protective layer, and a coating window disposed directly on the polarization unit and including a resin material. The polarization unit overlaps the bending area and the non-bending area. The polarization unit covers the display panel bendable portion.

20 Claims, 26 Drawing Sheets

(51) Int. Cl.
    *H10K 59/40*        (2023.01)
    *H10K 71/00*        (2023.01)
    *H10K 102/00*      (2023.01)

(52) U.S. Cl.
    CPC ......... *H10K 59/8792* (2023.02); *H10K 71/00*
       (2023.02); *H05K 2201/10128* (2013.01); *H10K*
                               *2102/311* (2023.02)

(56)                 References Cited

U.S. PATENT DOCUMENTS

| | | | |
|---|---|---|---|
| 10,658,615 | B2 | 5/2020 | Oh et al. |
| 10,910,589 | B2 * | 2/2021 | Jeong ................... H10K 77/111 |
| 2018/0182829 | A1 * | 6/2018 | Shin ...................... G06F 1/1652 |
| 2019/0305234 | A1 * | 10/2019 | Jung ...................... H05K 1/189 |
| 2021/0375166 | A1 * | 12/2021 | Park ...................... G06F 1/1658 |
| 2022/0013517 | A1 * | 1/2022 | Lee ...................... H10K 59/131 |
| 2022/0344618 | A1 * | 10/2022 | Kim ................... H10K 59/8791 |
| 2023/0018834 | A1 * | 1/2023 | Lim ................... H10K 59/873 |
| 2024/0215377 | A1 * | 6/2024 | Kim ...................... H10K 59/80 |
| 2024/0281036 | A1 * | 8/2024 | Lee ...................... G06F 1/1656 |

FOREIGN PATENT DOCUMENTS

| | | | |
|---|---|---|---|
| KR | 20200020364 | A | 2/2020 |
| KR | 102315544 | B1 | 10/2021 |

* cited by examiner

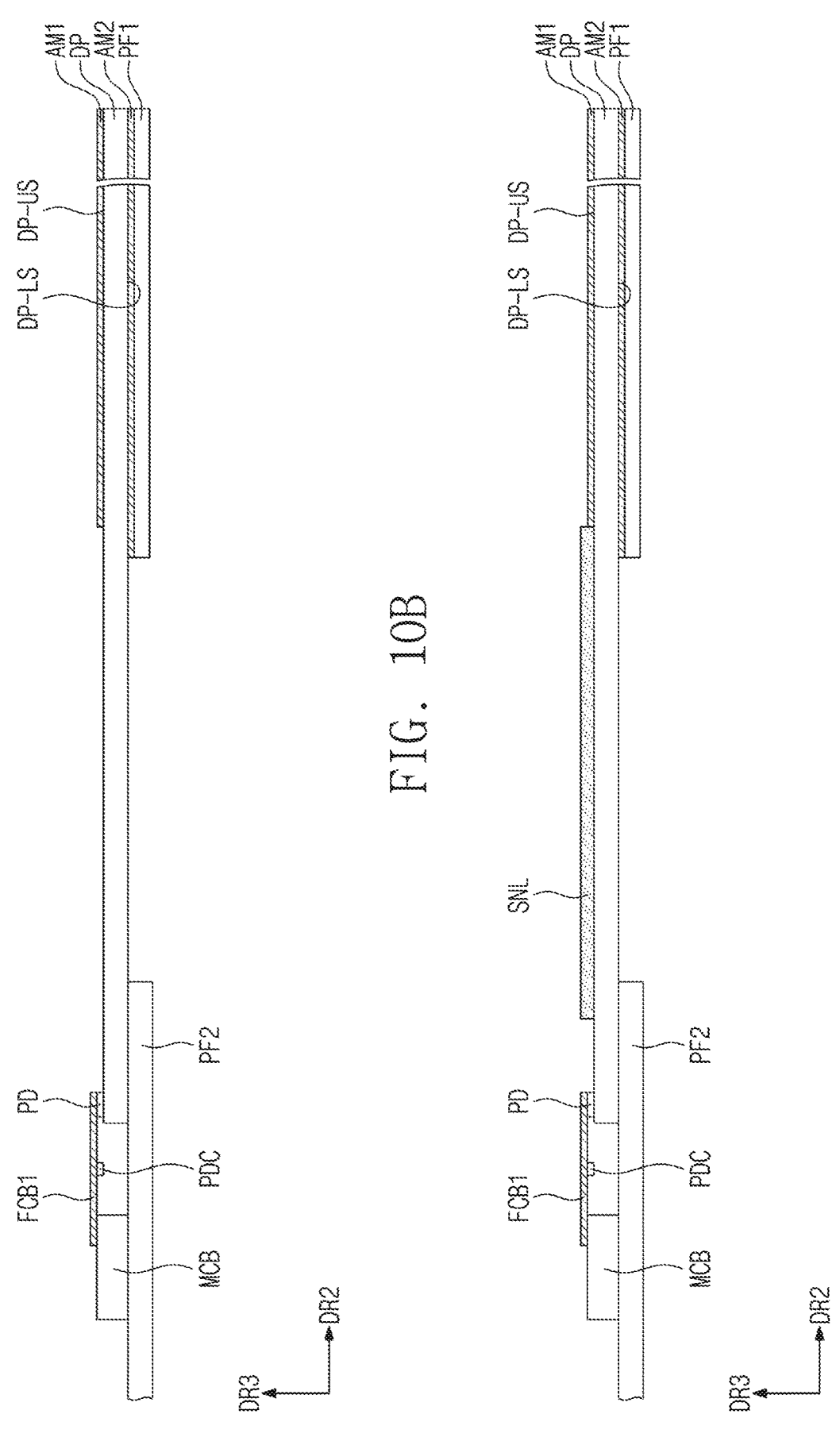

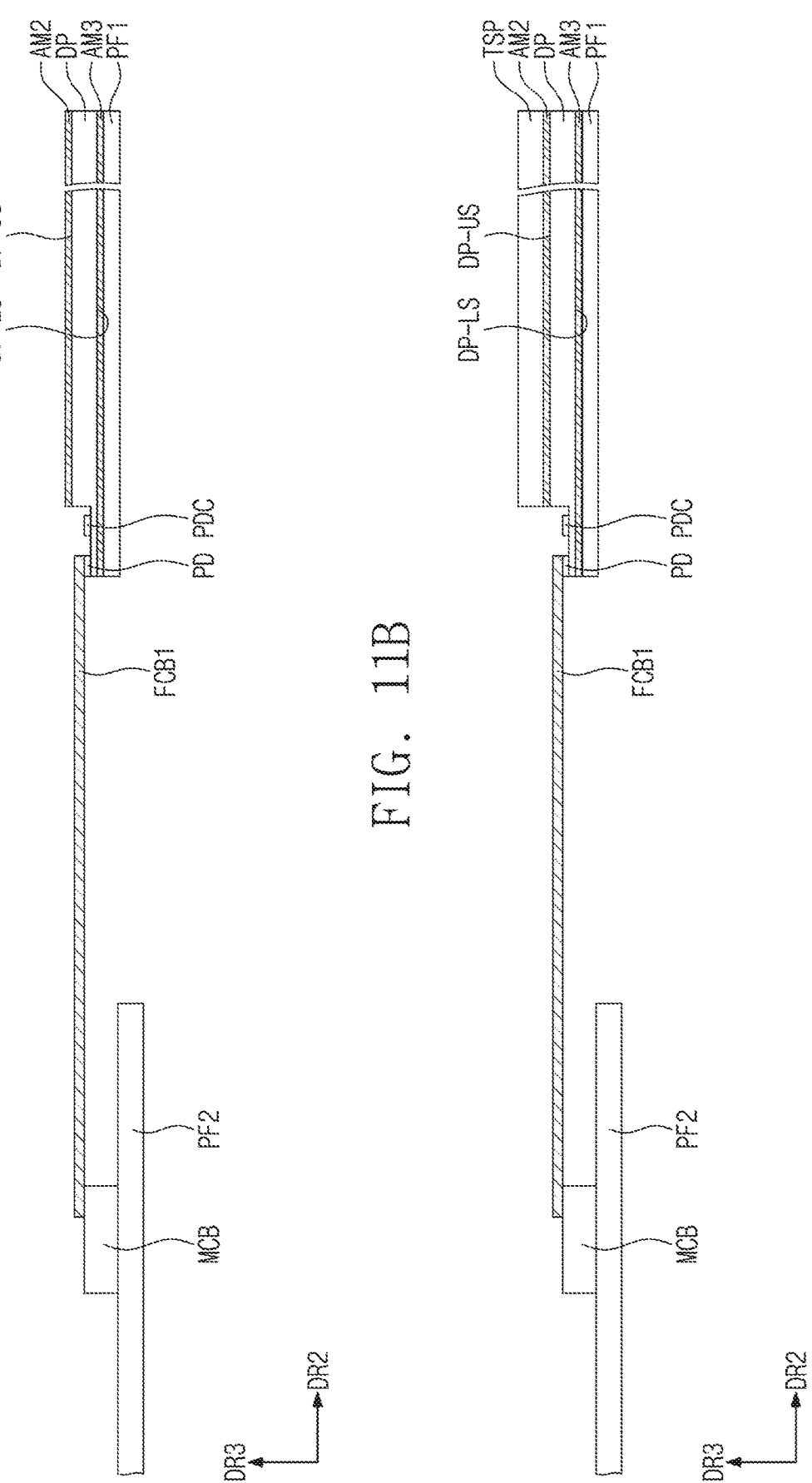

DISPLAY DEVICE AND METHOD OF MANUFACTURING THE SAME

This application claims priority to Korean Patent Application No. 10-2023-0031541, filed on Mar. 10, 2023, and all the benefits accruing therefrom under 35 U.S.C. § 119, the content of which in its entirety is herein incorporated by reference.

BACKGROUND

1. Field

The present disclosure relates to a display device and, more particularly, to a display device including a polarization unit in which a step difference is defined and a method of manufacturing the display device.

2. Description of the Related Art

Display devices that provide images to a user, such as a television set, a monitor, a smart phone, and a tablet computer, include a display panel to display the images. Various types of display panels, such as a liquid crystal display panel, an organic light emitting display panel, an electrowetting display panel, and an electrophoretic display panel, are being developed. In addition, the display devices include a window that protects the display panel.

SUMMARY

The present disclosure provides an embodiment of a display device including a coating window.

The present disclosure provides an embodiment of a method of manufacturing the display device including the coating window.

Embodiments of the invention provide a display device having a display panel including a non-bending area and a bending area extending from an end of the non-bending area and bent, a bending protective layer disposed on the display panel and bent with the bending area, a polarization unit disposed on the display panel, partially disposed on the bending protective layer, and provided with a step difference defined therein to correspond to the bending protective layer, and a coating window disposed directly on the polarization unit and including a resin material. The polarization unit overlaps the bending area and the non-bending area, and the polarization unit covers the bent portion of the display panel when viewed in a plan view.

In an embodiment, an outer side surface of the polarization unit is disposed at a same position as a point of the bent portion of the bending protective layer, which is located at the most distant position from the non-bending area, when viewed in the plane.

In an embodiment, an outer side surface of the polarization unit protrudes outward more than a point of the bent portion of the display panel, which is located at the most distant position from the non-bending area.

In an embodiment, the polarization unit includes a first polarization portion disposed on the display panel and overlapping the non-bending area and a second polarization portion disposed on the bending protective layer, extending from the first polarization portion, and overlapping the non-bending area, and the step difference is located at a boundary between the first polarization portion and second polarization portion.

In an embodiment, the first polarization portion has a thickness greater than a thickness of the second polarization portion.

In an embodiment, the second polarization portion is disposed directly on the bending protective layer.

In an embodiment, the second polarization portion has a planar shape corresponding to a planar shape of the bending protective layer when viewed in a plan view.

In an embodiment, the display device further includes a light blocking pattern disposed directly on the polarization unit and covering the bent portion of the display panel and the bent portion of the bending protective layer when viewed in a plan view.

In an embodiment, an outer side surface of the light blocking pattern protrudes outward more than a point of the bent portion of the display panel, which is located at the most distant position from the non-bending area.

In an embodiment, an outer side surface of the light blocking pattern and an outer side surface of the coating window are aligned with an outer side surface of the polarization unit when viewed in a plan view.

In an embodiment, an outer side surface of the polarization unit protrudes outward more than a point of the bent portion of the bending protective layer, which is located at the most distant position from the non-bending area.

In an embodiment, the display device further includes a main circuit board that is a rigid circuit board or a flexible circuit board and a first circuit board connected to an end portion of the display panel and electrically connecting the main circuit board and the display panel.

In an embodiment, the step difference is spaced apart from a side surface of the bending protective layer.

Embodiments of the invention provide a display device having a display panel including a display area and a non-display area surrounding the display area, a first circuit board overlapping the non-display area and including one end disposed on a front surface of the display panel and the other end disposed at a rear side of the display panel, a polarization unit disposed on the display panel and the first circuit board and provided with a step difference defined therein to correspond to the first circuit board, and a coating window disposed directly on the polarization unit and including a resin material. The polarization unit covers a bent portion of the first circuit board when viewed in a plan view.

In an embodiment, an outer side surface of the polarization unit protrudes outward more than a point of the bent portion of the first circuit board, which is located at the most distant position from a non-bending area.

In an embodiment, the polarization unit includes a first polarization portion disposed on the display panel and having a first thickness and a second polarization portion extending from the first polarization portion, having a second thickness smaller than the first thickness, and overlapping the bent portion of the first circuit board, and the step difference is located at a boundary between the first polarization portion and the second polarization portion.

In an embodiment, the display device further includes a touch sensing panel disposed between the display panel and the polarization unit, connected to the first circuit board, and sensing an input signal and a main circuit board electrically connected to the touch sensing panel by the first circuit board.

In an embodiment, the display device further includes a light blocking pattern disposed directly on the polarization unit and covering the bent portion of the first circuit board when viewed in a plan view.

Embodiments of the invention provide a method of manufacturing a display device. The method includes forming a first member that is bendable on a display panel including a display area and a non-display area surrounding the display area, forming a polarization unit in which a step difference corresponding to the first member is defined on the display panel and the first member, forming a light blocking pattern on the polarization unit to overlap the bent portion of the first member, forming a coating window including a resin material on the polarization unit, and bending the first member. The polarization unit covers the bent portion of the first member when viewed in a plan view.

In an embodiment, the forming of the coating window includes coating the resin material on the polarization unit and curing the coated resin material.

In an embodiment and according to the above, the polarization unit of the display device extends to cover the bent portion of the display panel when viewed in the plane, and the light blocking pattern is disposed on the polarization unit. Thus, the bent portion of the display panel is prevented from being viewed from the outside.

In an embodiment and according to the above, the extended polarization unit serves as a base layer in a manufacturing process of the coating window.

In an embodiment and according to the above, as the method of manufacturing the display device is simplified, the process reliability is improved and the cost of manufacture is reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings:

FIG. 5A is a side view of a display device, according to an embodiment;

FIG. 9A is a side view of a display device, according to an embodiment;

FIG. 10A is a side view of a display device illustrating a method of manufacturing the display device, according to an embodiment;

FIG. 10B is a side view of a display device illustrating a method of manufacturing the display device, according to an embodiment;

FIG. 11A is a side view of a display device illustrating a method of manufacturing the display device, according to an embodiment;

FIG. 11B is a side view of a display device illustrating a method of manufacturing the display device, according to an embodiment;

DETAILED DESCRIPTION

Figure 1:
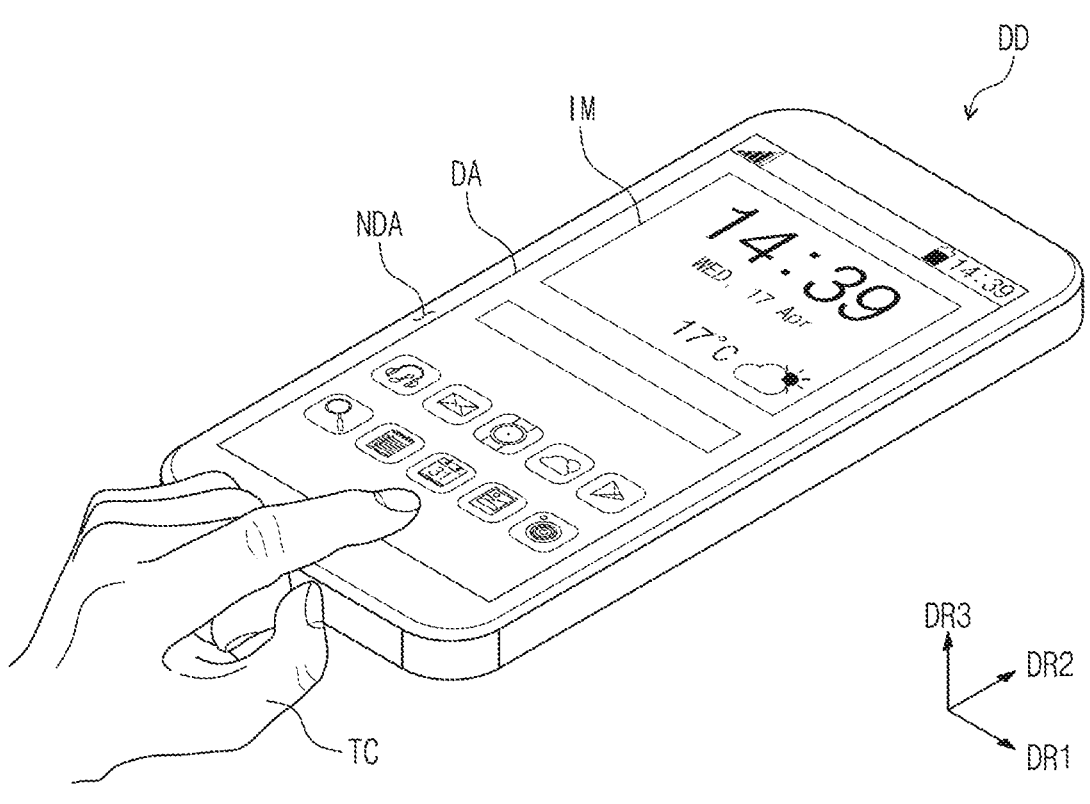
FIG. 1 is a perspective view of a display device, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the present disclosure, it will be understood that when an element (or area, layer, or portion) is referred to as being "on", "connected to" or "coupled to" another element or layer, it can be directly on, connected or coupled to the other element or layer or intervening elements or layers may be present and/or disposed therebetween.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures. The terms are used as a relative concept and are described with reference to the position and/or direction indicated in the drawings It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

As used herein, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the invention will be described with reference to accompanying drawings.

FIG. 1 is a perspective view of a display device DD according to an embodiment.

Referring to FIG. 1, a portable terminal is shown as a representative example of the display device DD according to an embodiment. The portable terminal may include a tablet PC, a smartphone, a personal digital assistant (PDA), a portable multimedia player (PMP), a game unit, a wristwatch type electronic device, and/or the like, however, the invention should not be limited thereto or thereby.

In an embodiment, the display device DD may be applied to a large-sized electronic device, such as a television set, an outdoor billboard, and/or the like, and/or a small and medium-sized electronic device, such as a personal computer, a notebook computer, a car navigation unit, a camera, and/or the like. However, these are merely examples, and the display device DD may be employed in other electronic items as desired.

In an embodiment, the display device DD may be flexible. The term "flexible" used herein refers to the property of being able to be bent from a structure that is completely bent to a structure that is bent at the scale of a few nanometers. For example, the flexible display device DD may be a curved display device, a foldable display device, a slidable display device, and/or a rollable display device. However, the invention should not be limited thereto or thereby, and the display device DD may be rigid.

In an embodiment and as shown in FIG. 1, a display surface on which an image IM is displayed may be substantially parallel to a plane defined by a first direction DR1 and a second direction DR2. The display device DD may include a plurality of areas distinguished from each other on the display surface. The display surface may include a display area DA on which the image IM is displayed and a non-display area NDA around the display area DA. The non-display area NDA may be referred to as a bezel area. As an example, the display area DA may have a quadrangular shape. The non-display area NDA may surround the display area DA. In addition, although not shown in the figures, the display device DD may have a curved shape in a portion thereof. In this case, the curved shape May be defined in a portion of the display area DA.

In an embodiment, the front (or upper) and rear (or lower) surfaces of each member of the display device DD may be opposite to each other in a third direction DR3, and a normal line direction of each of the front and rear surfaces may be substantially parallel to the third direction DR3. A separation distance between the front and rear surfaces of each member (or each unit) in the third direction DR3 may correspond to a thickness in the member (or the unit) in the third direction DR3. In the present disclosure, the expression "when viewed in a plane" may mean a state of being viewed in the third direction DR3. In the present disclosure, the expression "on a cross-section" may mean a state of being viewed in the first direction DR1 or the second direction DR2. Meanwhile, directions indicated by the first, second, and third directions DR1, DR2, and DR3, respectively, may be relative to each other, and thus, the directions indicated by the first, second, and third directions DR1, DR2, and DR3, respectively, may be changed to other directions.

In an embodiment, the front surface (or the upper surface or a first surface) and the rear surface (or the lower surface or a second surface) of each member of the display device DD may be defined with respect to a direction in which the image IM is displayed.

In an embodiment, the display device DD may sense a touch input TC generated by a user and applied thereto from the outside. The touch input TC by the user may include a variety of external inputs, such as a touch event generated by a user's body part, light, heat, pressure, etc. In an embodiment, the touch event generated by a user's hand will be described as the touch input TC by the user, however, this is merely an example. As described above, the touch input TC by the user may be provided in various ways. In addition, the display device DD may sense the input by the user applied to a side and/or rear surface of the display device DD depending on its design, and it should not be particularly limited.

Figure 2:
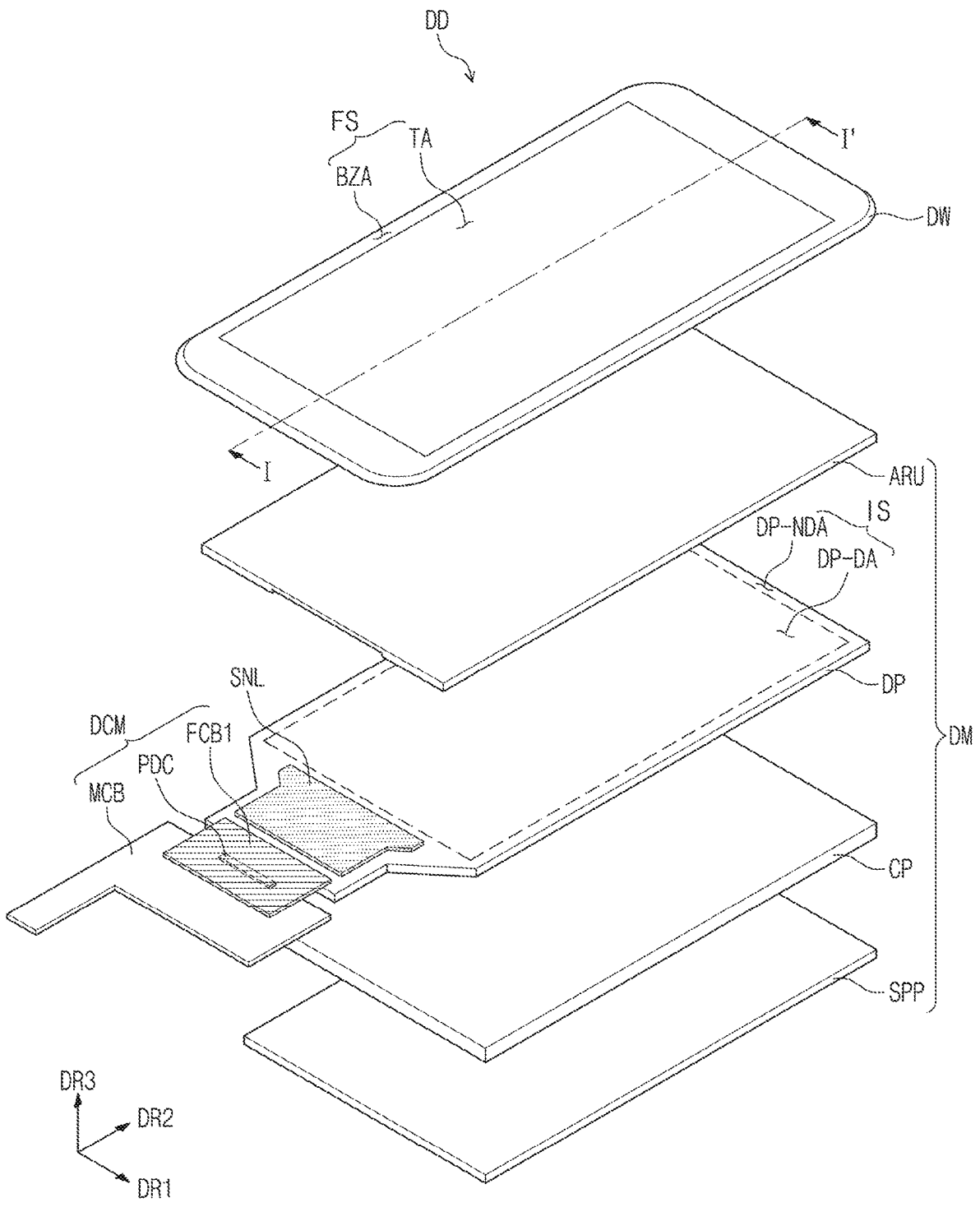
FIG. 2 is an exploded perspective view of a display device, according to an embodiment.

FIG. 2 is an exploded perspective view of the display device DD according to an embodiment.

In FIG. 2, adhesive members are not illustrated, and the adhesive members will be described in detail with reference to FIG. 5A.

In an embodiment and as shown in FIG. 2, the display device DD may include a coating window DW and a display module DM. The coating window DW may be disposed directly on the polarization unit ARU. The expression "the coating window DW is disposed directly on the polarization unit ARU" means that no separate adhesive or no adhesive layer is disposed between the coating window DW and the polarization unit ARU.

In an embodiment, the coating window DW may provide a front surface FS of the display device DD. The front surface FS of the coating window DW may include a transmission area TA and a bezel area BZA. The transmission area TA of the coating window DW may be an optically transparent area. Accordingly, the coating window DW may transmit the image IM (refer to FIG. 1) provided from the display device DD through the transmission area TA, and a user may view the image IM.

In an embodiment, the bezel area BZA of the coating window DW May overlap a light blocking pattern BM (refer to FIG. 5A) described later. The light blocking pattern BM may be a rigid substrate including a material having a predetermined color. The bezel area BZA of the coating window DW may prevent components of a display panel DP, which are disposed to overlap the light blocking pattern BM, from being viewed from the outside.

In an embodiment, the bezel area BZA may be defined adjacent to the transmission area TA, and the shape of the transmission area TA may be defined by the bezel area BZA. As an example, the bezel area BZA may be disposed outside the transmission area TA and may surround the transmission area TA, however, it should not be limited thereto or thereby. The bezel area BZA may be defined adjacent to only one side of the transmission area TA or may be omitted. In addition, the bezel area BZA may be defined at a side surface of the display device DD rather than the front surface FS of the display device DD.

In an embodiment, the coating window DW may include an optically transparent insulating material. As an example, the coating window DW may include a resin material. The coating window DW may have a single-layer or multi-layer structure. According to the display device DD including the coating window DW, a lamination process may be omitted in a method of manufacturing the display device DD. Accordingly, the manufacturing method of the display device DD may be simplified, and a manufacturing cost of the display device DD may be reduced.

In an embodiment, the coating window DW may include functional layers, such as an anti-fingerprint layer, an anti-reflection layer, a hard coating layer, etc. In an embodiment, the coating window DW may have a flat shape in a display area DP-DA, however, the shape of the coating window DW may be changed. Edges of the coating window DW, which face each other in the first direction DR1, may be provided with a rounded surface.

In an embodiment, the display module DM may be disposed on a rear surface of the coating window DW and may generate the image. In addition, the display module DM may sense the touch input TC (refer to FIG. 1) of the user.

In an embodiment, the display module DM that provides the flat display surface is shown as a representative example, however, the shape of the display module DM may be changed. Edges of the display module DM, which face each other in the first direction DR1, may be bent from center portions thereof and may be provided with the rounded surfaces.

In an embodiment, the display module DM may include the polarization unit ARU, the display panel DP, a protective panel CP, a support panel SPP, and a driving control module DCM.

In an embodiment, the polarization unit ARU may be disposed on the display panel DP, and a portion of the polarization unit ARU may be disposed on a bending protective layer SNL. A step difference SP (refer to FIG. 5A) corresponding to the bending protective layer SNL may be defined in the polarization unit ARU. The polarization unit ARU may be a polarization film, a polarization filter, or a polarization plate. The polarization unit ARU may be disposed between the coating window DW and the display panel DP. The polarization unit ARU may reduce a reflectance of a light incident thereto from the outside. The polarization unit ARU may be attached to the display panel DP by an adhesive layer. A groove corresponding to the bending protective layer SNL may be defined at one side of the polarization unit ARU. This will be described in detail later.

In an embodiment, the display panel DP may be disposed between the coating window DW and the support panel SPP. The display panel DP may display the image IM in response to the electrical signals. According to an embodiment, the display panel DP may be a light-emitting type display panel, however, it should not be particularly limited. For instance, the display panel DP may be an organic light emitting display panel, an inorganic light emitting display panel, an organic-inorganic light emitting display panel, and/or a quantum dot light emitting display panel. A light emitting layer of the organic light emitting display panel may include an organic light emitting material. A light emitting layer of the inorganic light emitting display panel may include an inorganic light emitting material. A light emitting layer of the organic-inorganic light emitting display panel may include an organic-inorganic light emitting material. A light emitting layer of the quantum dot light emitting display panel may include a quantum dot or a quantum rod.

In an embodiment, the image IM (refer to FIG. 1) provided by the display device DD may be displayed through a front surface IS of the display panel DP. The front surface IS of the display panel DP may include the display area DP-DA and a non-display area DP-NDA. The display area DP-DA may correspond to the display area DA of FIG. 1, and the non-display area DP-NDA may correspond to the non-display area NDA of FIG. 1.

Figure 3:
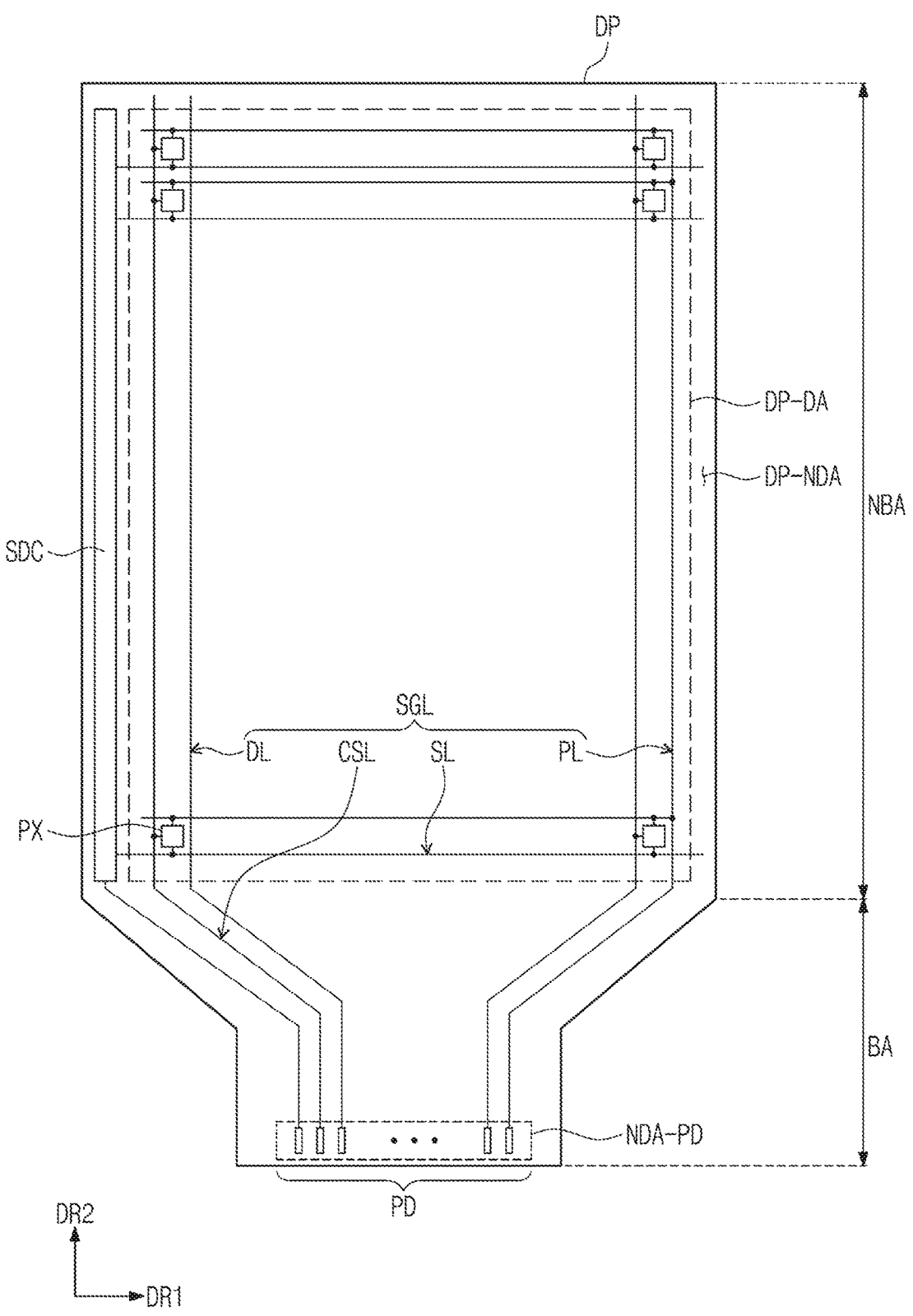
FIG. 3 is a plan view of a display panel according to an, embodiment.

In an embodiment, the bending protective layer SNL may be disposed on the display panel DP and may be bent with a bending area BA (refer to FIG. 3). The bending protective layer SNL may prevent a bent portion of the display panel DP from being damaged by external impacts and/or may prevent external foreign substances from entering the display panel DP. The bending protective layer SNL shown in FIG. 2 is merely an example, and the shape of the bending protective layer SNL may be changed as needed.

In an embodiment, the bending protective layer SNL may be disposed on the front surface of the display panel DP and may protect the bent portion of the display panel DP. The bending protective layer SNL may include a plastic film as its base layer. The bending protective layer SNL may include the plastic film containing any one selected from the group consisting of polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), poly (arylene ether sulfone), and combinations thereof.

However, in an embodiment, a material for the bending protective layer SNL should not be limited to plastic resins, and organic/inorganic composite material may be used as the material for the bending protective layer SNL. The bending protective layer SNL may include a porous organic layer and an inorganic material filled in pores of the organic layer. The bending protective layer SNL may have a single-layer or multi-layer structure.

In an embodiment, the display area DP-DA may be activated in response to electrical signals, and the image IM may be displayed through the display area DP-DA. According to an embodiment, the display area DP-DA of the display panel DP may correspond to the transmission area TA of the coating window DW. Meanwhile, in the following descriptions, the expression "An area/portion corresponds to another area/portion." means that "An area/portion overlaps another area/portion.", but they should not be limited to having the same area and/or the same shape.

In an embodiment, the non-display area DP-NDA may be defined adjacent to an outer side of the display area DP-DA. As an example, the non-display area DP-NDA may surround the display area DP-DA, however, it should not be limited thereto or thereby. According to an embodiment, the non-display area DP-NDA may be defined in a variety of shapes.

In an embodiment, a driving circuit or a driving line to drive elements arranged in the display area DP-DA, various signal lines to provide electrical signals, and pads may be disposed in the non-display area DP-NDA. The non-display area DP-NDA of the display panel DP may correspond to the bezel area BZA of the coating window DW. Components of the display panel DP, which are disposed in the non-display area DP-NDA, may be prevented from being viewed from the outside by the bezel area BZA.

In an embodiment, the driving control module DCM may include a main circuit board MCB (or a driving circuit board), a first circuit board FCB1 (or a panel flexible circuit board), and a panel driving circuit PDC. The first circuit board FCB1 may be connected to an end portion of the display panel DP to electrically connect the main circuit board MCB to the display panel DP.

In an embodiment, the first circuit board FCB1 may electrically connect the main circuit board MCB to the display panel DP, and the panel driving circuit PDC may be mounted on the first circuit board FCB1. The panel driving circuit PDC may be implemented in an integrated circuit. Although not shown in the figures, a plurality of passive elements and/or a plurality of active elements may be mounted on the main circuit board MCB. The main circuit board MCB may be a rigid circuit board or a flexible circuit board, and the first circuit board FCB1 may be a flexible circuit board.

In an embodiment, the protective panel CP may be disposed on a rear surface of the display panel DP and may protect the display panel DP from impacts. The protective panel CP may include a plastic film as its base layer. The protective panel CP may include a single-layer or multi-layer structure.

In an embodiment, the support panel SPP may be disposed on a rear surface of the protective panel CP and may support the display panel DP and the protective panel CP. The support panel SPP may be a metal plate with a rigidity higher than a reference level. The support panel SPP may be a stainless steel plate. The support panel SPP may have a black (or dark) color to block an external light incident into the display panel DP.

FIG. 3 is a plan view of the display panel DP according to an embodiment.

FIG. 3 schematically shows an embodiment of a signal circuit diagram. In addition, for the convenience of explanation, some components are omitted in FIG. 3.

In an embodiment and as shown in FIG. 3, the display panel DP may include the display area DP-DA and the non-display area DP-NDA when viewed in the plane. In an embodiment, the non-display area DP-NDA may be defined along an edge of the display area DP-DA. The display area DP-DA and the non-display area DP-NDA of the display panel DP may respectively correspond to the display area DA and the non-display area NDA of the display device DD shown in FIG. 1.

In an embodiment, the display panel DP may include a non-bending area NBA and the bending area BA extending from an end of the non-bending area NBA and being bent. As shown in FIG. 3, the non-bending area NBA may be disposed at an upper side in the second direction DR2, and the bending area BA may be disposed at a lower side in the second direction DR2. A lower end of the bending area BA may be bent and may be disposed to face the non-bending area NBA. This will be described with reference to FIG. 5B.

In an embodiment, the display panel DP may include a scan driving circuit SDC, a plurality of signal lines SGL, a plurality of signal pads PD, and a plurality of pixels PX. The pixels PX may be disposed in the display area DP-DA. Each of the pixels PX May include an organic light emitting diode and a pixel driving circuit connected to the organic light emitting diode.

In an embodiment, the scan driving circuit SDC may generate a plurality of scan signals and may sequentially output the scan signals to a plurality of scan lines SL described later. The scan driving circuit SDC may further output a control signal to the pixel driving circuit of the pixels PX.

In an embodiment, the scan driving circuit SDC may include a plurality of thin film transistors formed through the same process as the driving circuit of the pixels PX, e.g., a low temperature polycrystalline silicon (LTPS) process or a low temperature polycrystalline oxide (LTPO) process.

In an embodiment, the signal lines SGL may include the scan lines SL, data lines DL, a power line PL, and a control signal line CSL. Each of the scan lines SL may be connected to a corresponding pixel PX among the pixels PX, and each of the data lines DL may be connected to a corresponding pixel PX among the pixels PX. The power line PL may be connected to the pixels PX. The control signal line CSL may provide control signals to the scan driving circuit SDC.

In an embodiment, the signal lines SGL may overlap the display area DP-DA and the non-display area DP-NDA. The signal lines SGL may include a pad part and a line part. The line part may overlap the display area DP-DA and the non-display area DP-NDA. The pad part may be connected to an end of the line part. The pad part may be disposed in the non-display area DP-NDA and may overlap a corresponding signal pad among the signal pads PD. In the non-display area DP-NDA, an area where the signal pads PD are arranged may be defined as a pad area NDA-PD.

In an embodiment, the line part connected to the pixel PX may substantially form most of the signal lines SGL. The line part may be connected to transistors (not shown) of the pixel PX. The line part may have a single-layer or multi-layer structure, and the line part may be provided in the form of a single body or may be implemented by two portions or more. The two or more portions may be disposed on different layers from each other and may be connected to each other via a contact hole defined through an insulating layer disposed between the two or more portions.

Figure 4A:
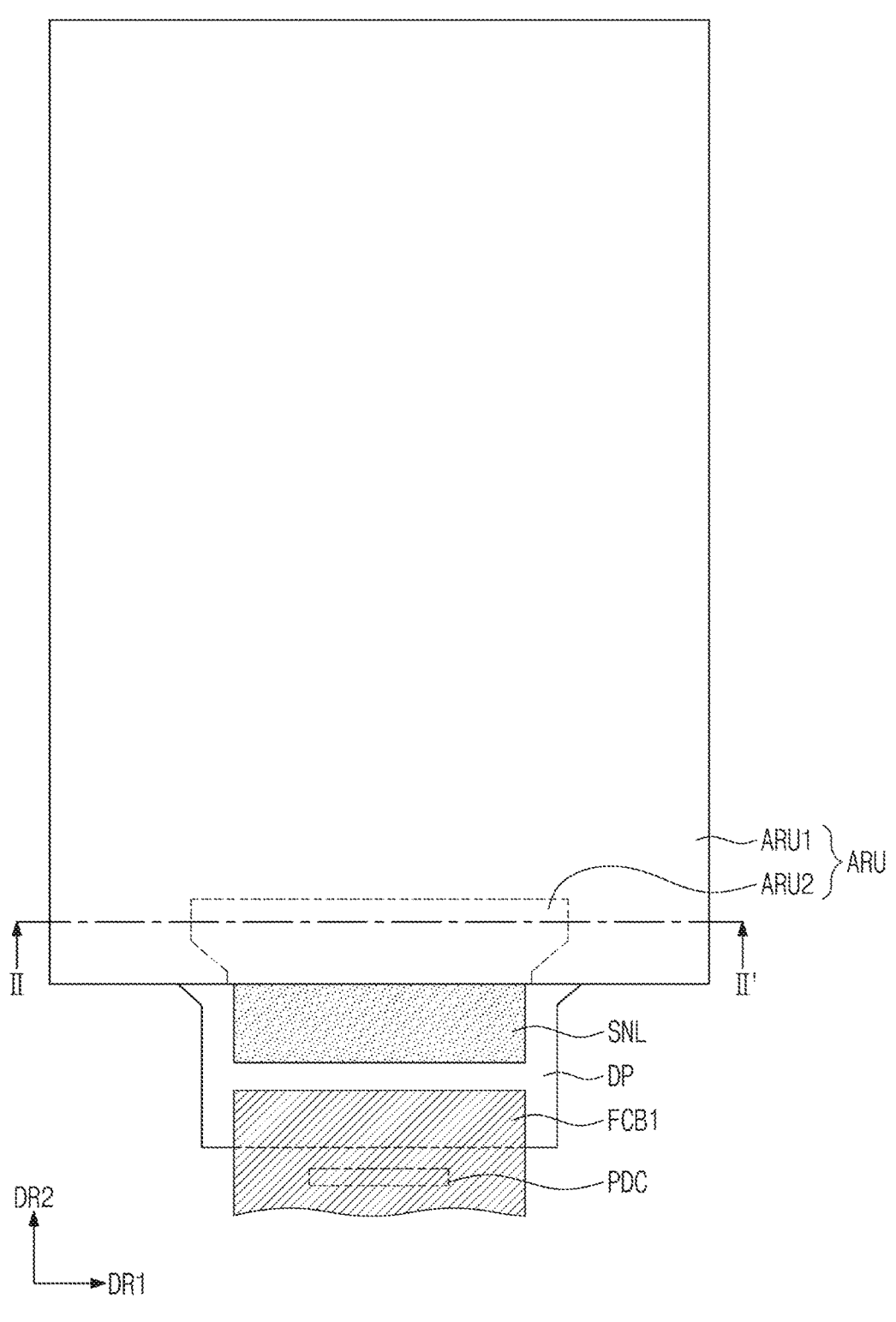
FIG. 4A is a plan view of a portion of a display panel and a polarization unit, according to an embodiment.

FIG. 4A is a plan view of a portion of the display panel DP and the polarization unit ARU according to an embodiment.

In an embodiment and referring to FIG. 4A, the polarization unit ARU may include a first polarization portion ARU1 and a second polarization portion ARU2. In an embodiment, the second polarization portion ARU2 may correspond to the bending protective layer SNL, and the first polarization portion ARU1 may correspond to a remaining portion except the second polarization portion ARU2. The second polarization portion ARU2 may have a shape corresponding to a shape of the bending protective layer SNL when viewed in the plane. The shape of the second polarization portion ARU2 when viewed in the plane may have a size substantially equal to or greater than a size of the bending protective layer SNL when viewed in the plane. In the present disclosure, the expression "having substantially the same size" used herein may mean that the sizes will still be considered the same even if there is a slight difference in size, such as a process tolerance FIG. 4B is a cross-sectional view taken along a line II-IF of FIG. 4A, according to an embodiment.

Figure 4B:
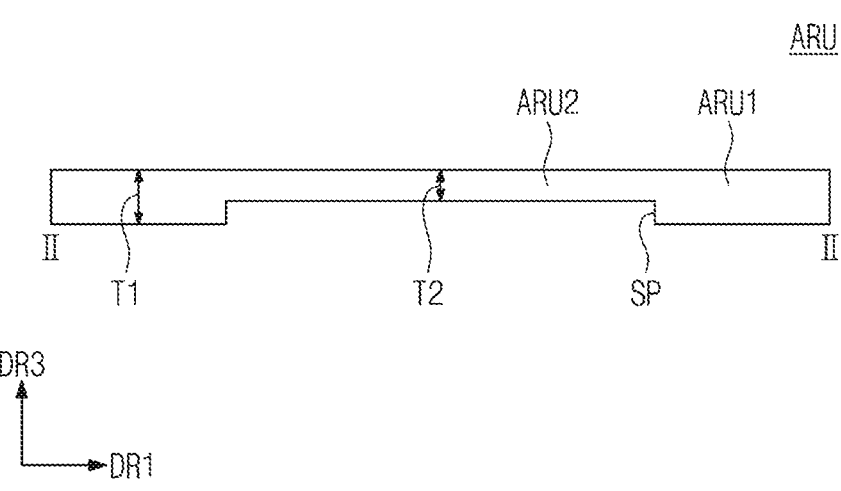
FIG. 4B is a cross-sectional view of a display panel taken along line II-IF of FIG. 4A, according to an embodiment.

In an embodiment and referring to FIG. 4B, the step difference SP may be present at a boundary between the first polarization portion ARU1 and the second polarization portion ARU2. An upper surface of the first polarization portion ARU1 and an upper surface of the second polarization portion ARU2 may form a flat plane. A lower surface of the first polarization portion ARU1 and a lower surface of the second polarization portion ARU2 May be disposed at different positions in the third direction DR3. The first polarization portion ARU1 may have a thickness T1 greater than a thickness T2 of the second polarization portion ARU2. Accordingly, a space may be formed between the lower surface of the second polarization portion ARU2 and an inner side surface of the first polarization portion ARU1. Referring to FIGS. 4A and 4B, the bending protective layer SNL may be disposed in the space described above.

In an embodiment, therefore, the polarization unit ARU may extend in a downward direction opposite to the third direction DR3 without being in contact with the bending protective layer SNL. In a case where the space described above is not formed, the polarization unit ARU may be lifted off in the direction toward the coating window DW (refer to FIG. 2) by the bending protective layer SNL when the polarization unit ARU extends. As a result, the external foreign substance may enter the display panel DP or cracks may occur.

Figure 5A:
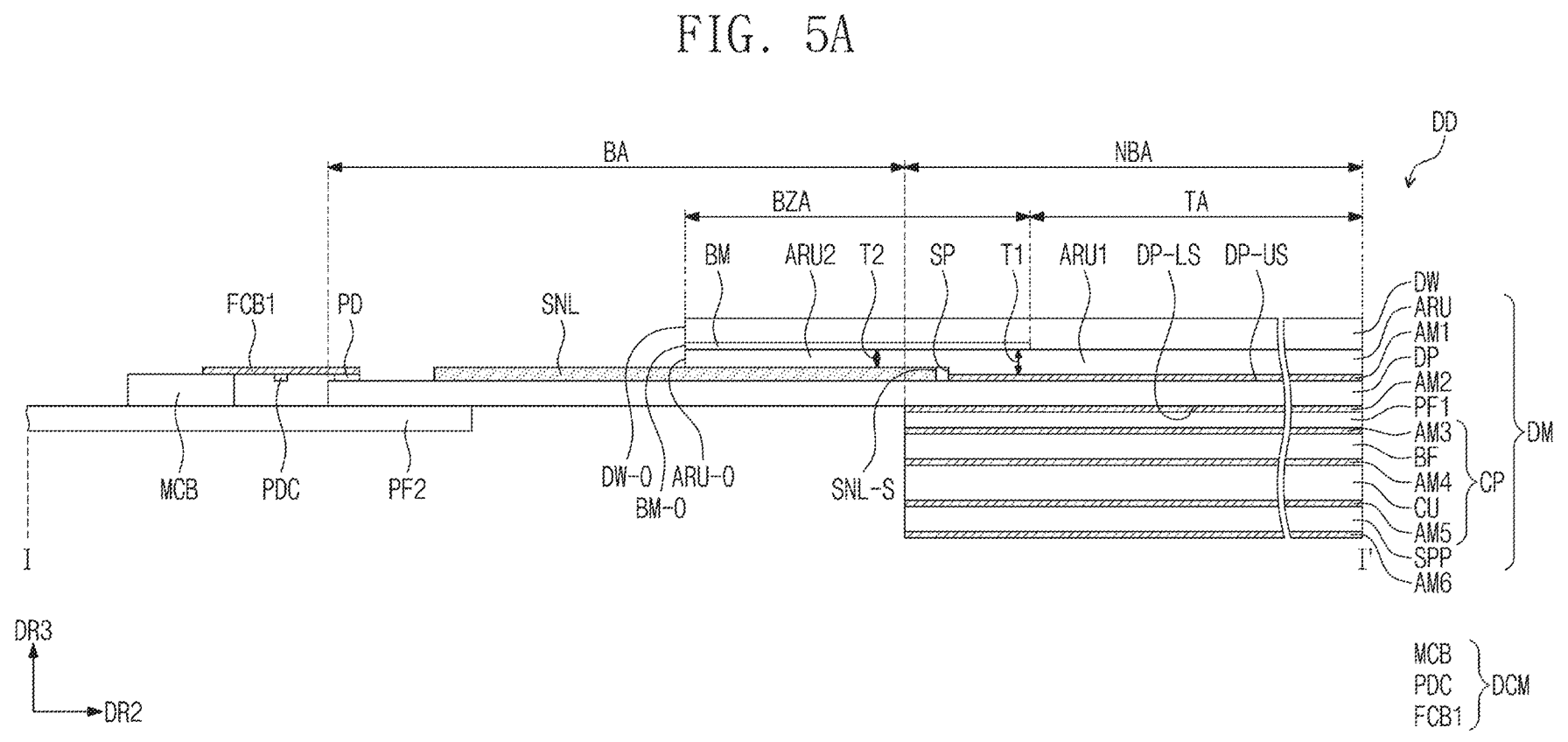
Figure 5B:
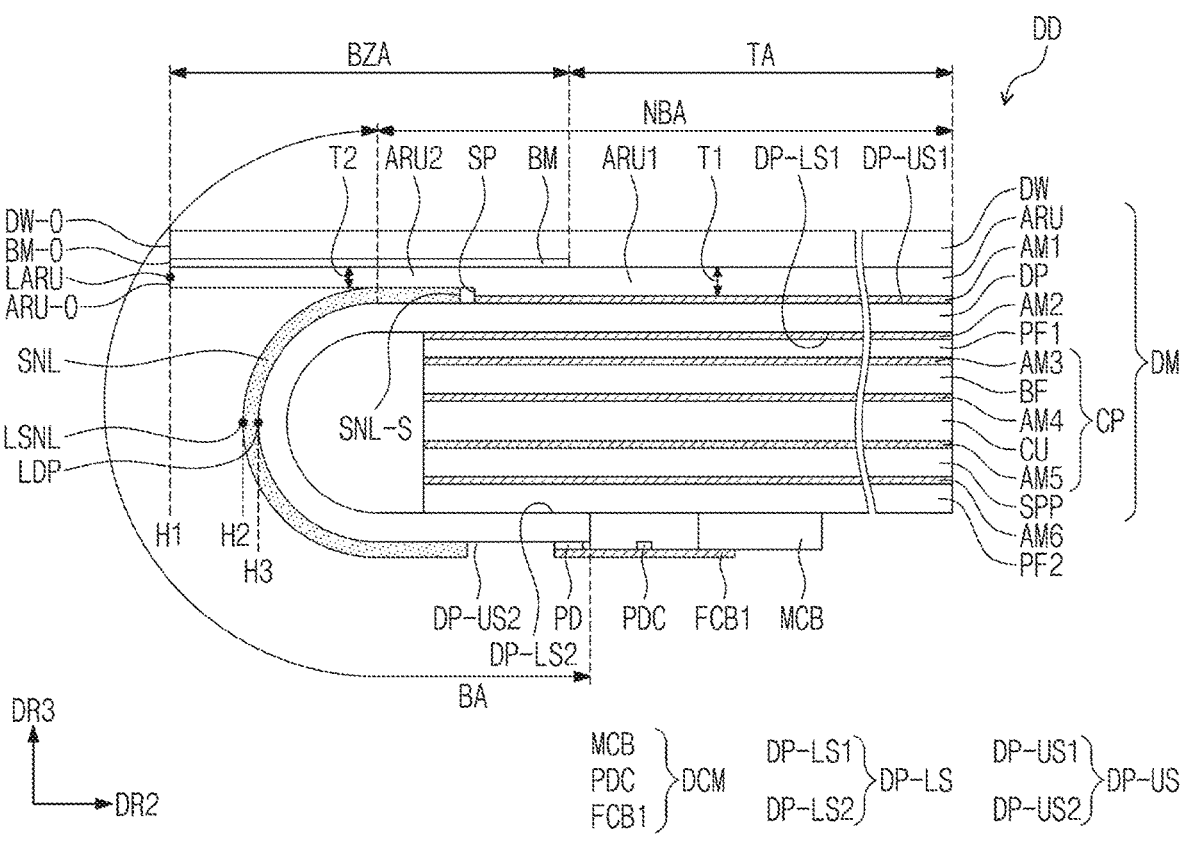
FIG. 5B is a side view of a display device, according to an embodiment.

FIG. 5A is a side view of the display device DD according to an embodiment. FIG. 5B is a side view of the display device DD according to an embodiment. In more detail, FIG. 5A is a cross-sectional view taken along a line I-I' of FIG. 2, and FIG. 5B shows a bent state of the bending area BA.

In an embodiment and referring to FIGS. 5A and 5B, the display panel DP is shown as having a single-layer structure, however, the display panel DP may have a multi-layer structure. The display panel DP may include a base layer, a circuit layer, a light emitting element layer, and/or an encapsulation layer. In addition, those skilled in the art can understand that other general-purpose components may be further included in the display panel DP.

In an embodiment, the stack structure of the display device DD is as shown in FIG. 5A. The display device DD may include the display module DM and the coating window DW disposed on the display module DM. The display module DM may include the display panel DP, the polarization unit ARU, a first protective film PF1, a second protective film PF2, the protective panel CP, the support panel SPP, and first, second, third, fourth, fifth, and sixth adhesive layers AM1, AM2, AM3, AM4, AM5, and AM6, respectively.

In an embodiment, each of the first adhesive layer AM1 to the sixth adhesive layer AM6, respectively, described hereinafter may be a pressure sensitive adhesive (PSA) film, an optically clear adhesive (OCA) film, or an optically clear resin (OCR). The first to sixth adhesive layers AM1 to AM6, respectively, may include a light curable adhesive material or a heat curable adhesive material, however, materials for the first to sixth adhesive layers AM1 to AM6, respectively, should not be particularly limited. Some of the first to sixth adhesive layers AM1 to AM6, respectively, may be omitted.

In an embodiment, the polarization unit ARU may be disposed on an upper surface DP-US of the display panel DP. The polarization unit ARU may overlap the bending area BA and the non-bending area NBA of the display panel DP. According to an embodiment, the polarization unit ARU may extend to the bending area BA without being disposed only in the non-bending area NBA. As described above, the extended polarization unit ARU May serve as a base layer to allow the light blocking pattern BM and the coating window DW to be disposed in the bending area BA. In particular, the polarization unit ARU may serve as the base layer when a resin material is coated to form the coating window DW. In addition, the polarization unit ARU may serve as a barrier to prevent a coating solution of the coating window DW from entering the bending protective layer SNL and the display panel DP, which are bent.

In an embodiment, the polarization unit ARU may include the first polarization portion ARU1 and the second polarization portion ARU2. The first polarization portion ARU1 may be disposed on the display panel DP and may overlap the non-bending area NBA. The second polarization portion ARU2 may be disposed on the bending protective layer SNL and may extend from the first polarization portion ARU1 to a direction opposite to the second direction DR2. The second polarization portion ARU2 may overlap the bending area BA and a portion of the non-bending area NBA.

In an embodiment, the first polarization portion ARU1 may be attached to the display panel DP by the first adhesive layer AM1. However, the first adhesive layer AM1 may be omitted when needed. The second polarization portion ARU2 may be disposed directly on the bending protective layer SNL without a separate adhesive layer. This is to prevent the bending protective layer SNL, which is in contact with the second polarization portion ARU2, from causing any disruption to a bending process when the bending protective layer SNL is bent with the display panel DP. In a case where the bending protective layer SNL is attached to the second polarization portion ARU2 by an adhesive layer, a stress may be applied to the second polarization portion ARU2 and the bending protective layer SNL during the bending process while the bending protective layer SNL is bent. Accordingly, the bending protective layer SNL or the second polarization portion ARU2 may be damaged.

In an embodiment, a sum of the thickness T1 of the first polarization portion ARU1 and a thickness of the first adhesive layer AM1 may be the same as a sum of the thickness T2 of the second polarization portion ARU2 and a thickness of the bending protective layer SNL. In a case where the first adhesive layer AM1 is omitted, the thickness T1 of the first polarization portion ARU1 may be the same as the sum of the thickness T2 of the second polarization portion ARU2 and the thickness of the bending protective layer SNL. The thickness T1 of the first polarization portion ARU1 may be greater than the thickness of the bending protective layer SNL.

In an embodiment, the step difference SP may be defined between the first polarization portion ARU1 and the second polarization portion ARU2. The step difference SP may be spaced apart from a side surface SNL-S of the bending protective layer SNL by a predetermined distance. A side surface of the first polarization portion ARU1, which defines the step difference SP, may be closer to a center of the non-bending area NBA than is the side surface SNL-S of the bending protective layer SNL. Accordingly, the side surface SNL-S of the bending protective layer SNL and the side surface of the first polarization portion ARU1 may be prevented from colliding with each other during the bending process.

In an embodiment, the bending protective layer SNL may be disposed on the display panel DP. The bending protective layer SNL may overlap the bending area BA and may be bent together with the display panel DP. A portion of the bending protective layer SNL may overlap the non-bending area NBA of the display panel DP.

In an embodiment, the driving control module DCM may be coupled with an end of the display panel DP. The driving control module DCM may include the first circuit board FCB1, the panel driving circuit PDC, and the main circuit board MCB. The first circuit board FCB1 may electrically connect the main circuit board MCB to the display panel DP, and the panel driving circuit PDC may be mounted on the first circuit board FCB1. In an embodiment, the structure in which the panel driving circuit PDC is disposed on the first circuit board FCB1 is shown, however, the position of the panel driving circuit PDC should not be limited thereto or thereby. As an example, the panel driving circuit PDC may be disposed directly on the upper surface DP-US of the display panel DP.

In an embodiment, the first circuit board FCB1 may be electrically connected to the signal pads PD. In this case, the signal pads PD may correspond to the signal pads PD disposed in the pad area NDA-PD of FIG. 3.

In an embodiment, the second protective film PF2 may be coupled with the end of the display panel DP and the driving control module DCM. When the display panel DP is bent, one surface of the second protective film PF2 may be in contact with the sixth adhesive layer AM6.

In an embodiment, the light blocking pattern BM may be disposed directly on the polarization unit ARU. The light blocking pattern BM may overlap the non-bending area NBA and the bending area BA of the display panel DP. Since the light blocking pattern BM blocks the light, the display panel DP, the signal line, and the bending protective layer SNL, which are disposed under the light blocking pattern BM, may not be perceived from the outside. The light blocking pattern BM may be printed on the polarization unit ARU. An outer side surface BM-O of the light blocking pattern BM may be aligned with an outer side surface ARU-O of the polarization unit ARU. That is, the outer side surface BM-O of the light blocking pattern BM and the outer side surface ARU-O of the polarization unit ARU may be aligned on a straight line when viewed in the cross-section.

In an embodiment, the coating window DW may be disposed on the polarization unit ARU without using a separate adhesive layer or adhesive member. The coating window DW may be formed by coating the resin material and curing the resin material. A step difference may be defined on a lower surface of the coating window DW to correspond to the light blocking pattern BM. An upper surface of the coating window DW may be flat even though the step difference is defined on the lower surface of the coating window DW due to the polarization unit ARU and the light blocking pattern BM. An outer side surface DW-O of the coating window DW may be aligned with the outer side surface BM-O of the light blocking pattern BM and the outer side surface ARU-O of the polarization unit ARU. Accordingly, the coating window DW, the light blocking pattern BM, and the polarization unit ARU may be prevented from being separated from each other due to the external impacts.

In an embodiment, the first protective film PF1 may be disposed on a rear surface DP-LS of the display panel DP. The first protective film PF1 may be attached to the rear surface DP-LS by the second adhesive layer AM2, however, the second adhesive layer AM2 may be omitted as needed. The first protective film PF1 may protect the rear surface DP-LS of the display panel DP from the external impacts.

In an embodiment, the protective panel CP may be disposed on the rear surface DP-LS of the display panel DP. The protective panel CP may protect the display panel DP from impacts applied thereto from a lower side of the protective panel CP.

In an embodiment, the protective panel CP may include the third adhesive layer AM3, a barrier layer BF, the fourth adhesive layer AM4, a cushion layer CU, and the fifth adhesive layer AM5. The barrier layer BF may be attached to a lower surface of the first protective film PF1 by the third adhesive layer AM3. The barrier layer BF may have a color with low light transmittance, and thus, components disposed under the barrier layer BF may be prevented from being viewed.

In an embodiment, the barrier layer BF may include a flexible synthetic resin film. As an example, the barrier layer BF may be a film containing polyimide (PI), polyethylene terephthalate (PET), and/or the like. However, it should not be limited thereto or thereby, and the barrier layer BF may include various materials.

In an embodiment, the cushion layer CU may be attached to a lower surface of the barrier layer BF by the fourth adhesive layer AM4. The cushion layer CU may absorb impacts applied to the display panel DP from a lower side thereof. The cushion layer CU may be a highly elastic material such as a foam sheet in which a plurality of openings is formed.

In an embodiment, the support panel SPP may be disposed under the protective panel CP and may support the display panel DP and the protective panel CP. The support panel SPP may be a metal plate with a predetermined rigidity. As an example, the support panel SPP may be a stainless steel plate. The support panel SPP may have a black color to block the external light incident into the display panel DP.

In an embodiment and referring to FIG. 5B, the display panel DP may be bent, and a portion of the display panel DP may be disposed under the support panel SPP. One surface of the second protective film PF2 may be directly attached to the sixth adhesive layer AM6. A first upper surface DP-US1 of the display panel DP, which is not bent, may be closer to the coating window DW than is a first lower surface DP-LS1. A second upper surface DP-US2 of the display panel DP, which is bent, may be farther away from the coating window DW than is a second lower surface DP-LS2. In this case, the bending protective layer SNL disposed on the display panel DP may be bent together with the display panel DP. The bending protective layer SNL may cover the bent portion of the display panel DP such that the bent portion of the display panel DP is not exposed, and thus, the bending protective layer SNL may protect the bending area BA of the display panel DP.

In an embodiment, the polarization unit ARU may cover the bent portion of the display panel DP. Since the light blocking pattern BM is disposed on the polarization unit ARU, the bent portion of the display panel DP may not be viewed from the outside. The outer side surface ARU-O of the polarization unit ARU may be farther away from the non-bending area NBA than a point LDP that is the most distant point from the non-bending area NBA in the bent portion of the display panel DP. The outer side surface ARU-O of the polarization unit ARU may protrude outward more than a point LSNL that is the most distant from the non-bending area NBA in the bent portion of the bending protective layer SNL.

In an embodiment, a position of a point LARU that is the most distant from the non-bending area NBA in the polarization unit ARU in the second direction DR2 may be defined as a first position H1. A position of the point LSNL that is the most distant from the non-bending area NBA in the bent portion of the bending protective layer SNL in the second direction DR2 may be defined as a second position H2. A position of the point LDP that is the most distant from the non-bending area NBA in the bent portion of the display panel DP in the second direction DR2 may be defined as a third position H3. The first position H1 may be farther away from the non-bending area NBA than the second position H2 and the third position H3 are. The second position H2 may be farther away from the non-bending area NBA than the third position H3 is.

In an embodiment, the light blocking pattern BM may cover the bent portion of the display panel DP and the bent portion of the bending protective layer SNL when viewed in the plane. The outer side surface BM-O of the light blocking pattern BM may protrude outward more than the point LDP that is the most distant from the non-bending area NBA in the bent portion of the display panel DP.

In an embodiment, in the case where the coating window DW is formed by coating the resin material and curing the resin material, it may be impossible to combine the light blocking pattern BM separately on the rear surface of the coating window DW. Accordingly, the light blocking pattern BM may be required to be disposed on an upper surface of the polarization unit ARU disposed under the coating window DW. In the case of a conventional polarization unit ARU in which the polarization unit ARU does not extend to the bending area BA, the light blocking pattern BM also does not extend to the bending area BA. In this case, the bent display panel DP and the bent bending protective layer SNL May be viewed from the outside. According to the present disclosure, the step difference may be formed in the polarization unit ARU, and the polarization unit ARU may extend to the bending area BA. Accordingly, the light blocking pattern BM may also extend to the bending area BA, and the bent portion of the display panel DP and the bent portion of the bending protective layer SNL may not be viewed from the outside.

Figure 5C:
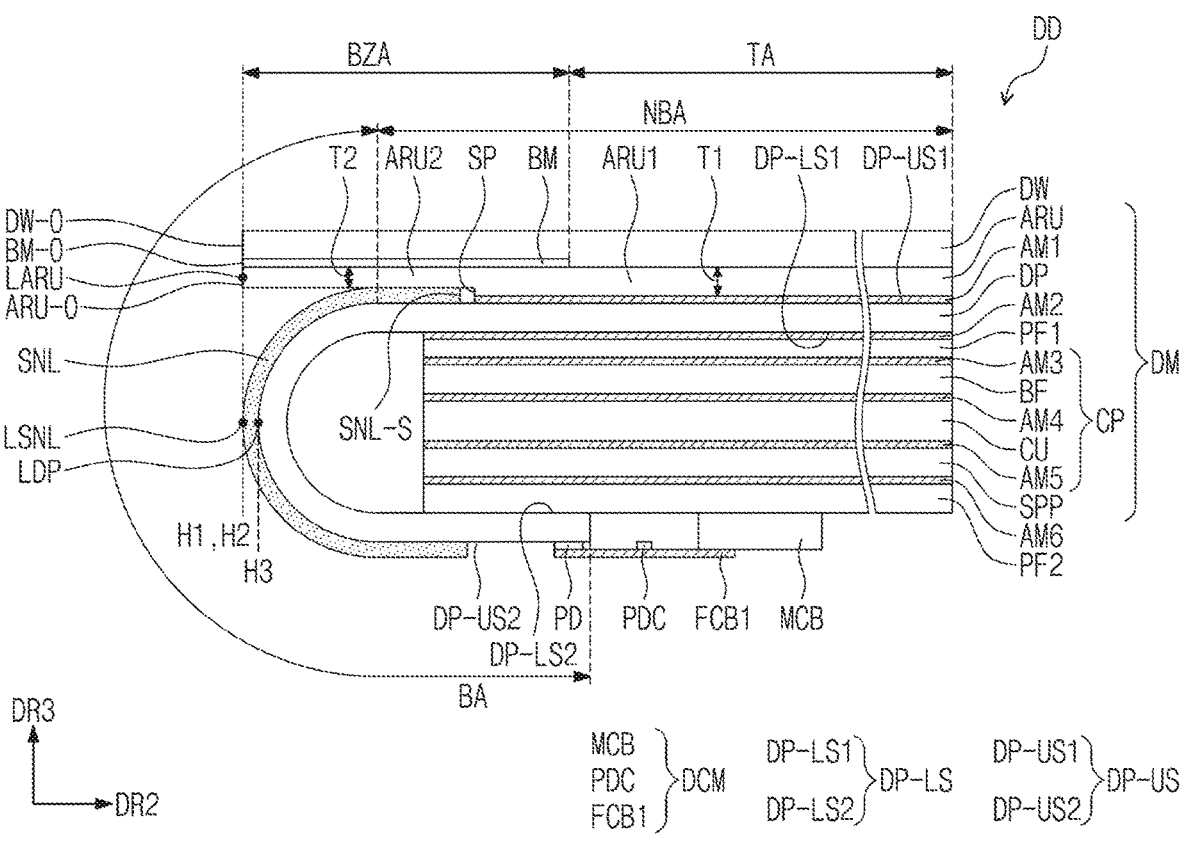
FIG. 5C is a side view of a display device, according to an embodiment.

FIG. 5C is a side view of a display device DD according to an embodiment.

In an embodiment, the display device DD shown in FIG. 5C has the same structures and functions as those of the display device DD described with reference to FIG. 5B except for a position of a polarization unit ARU, a position of a light blocking pattern BM, and a position of a coating window DW. Accordingly, in FIG. 5C, the same reference numerals denote the same elements in FIG. 5B, and thus, detailed descriptions of the same elements will be omitted.

In an embodiment, an outer side surface ARU-O of the polarization unit ARU may be disposed at the same position as a point LSNL that is the most distant from a non-bending area NBA in a bent portion of a bending protective layer SNL when viewed in the plane. That is, a first position H1 and a second position H2 may be disposed at the same position in the second direction DR2. In this case, the light blocking pattern BM may cover a bent portion of the display panel DP and the bent portion of the bending protective layer SNL when viewed in the plane, and thus, the bent portion of the display panel DP and the bent portion of the bending protective layer SNL may not be viewed from the outside. In addition, the size of display device DD may be prevented from being unnecessarily large.

Figure 6:
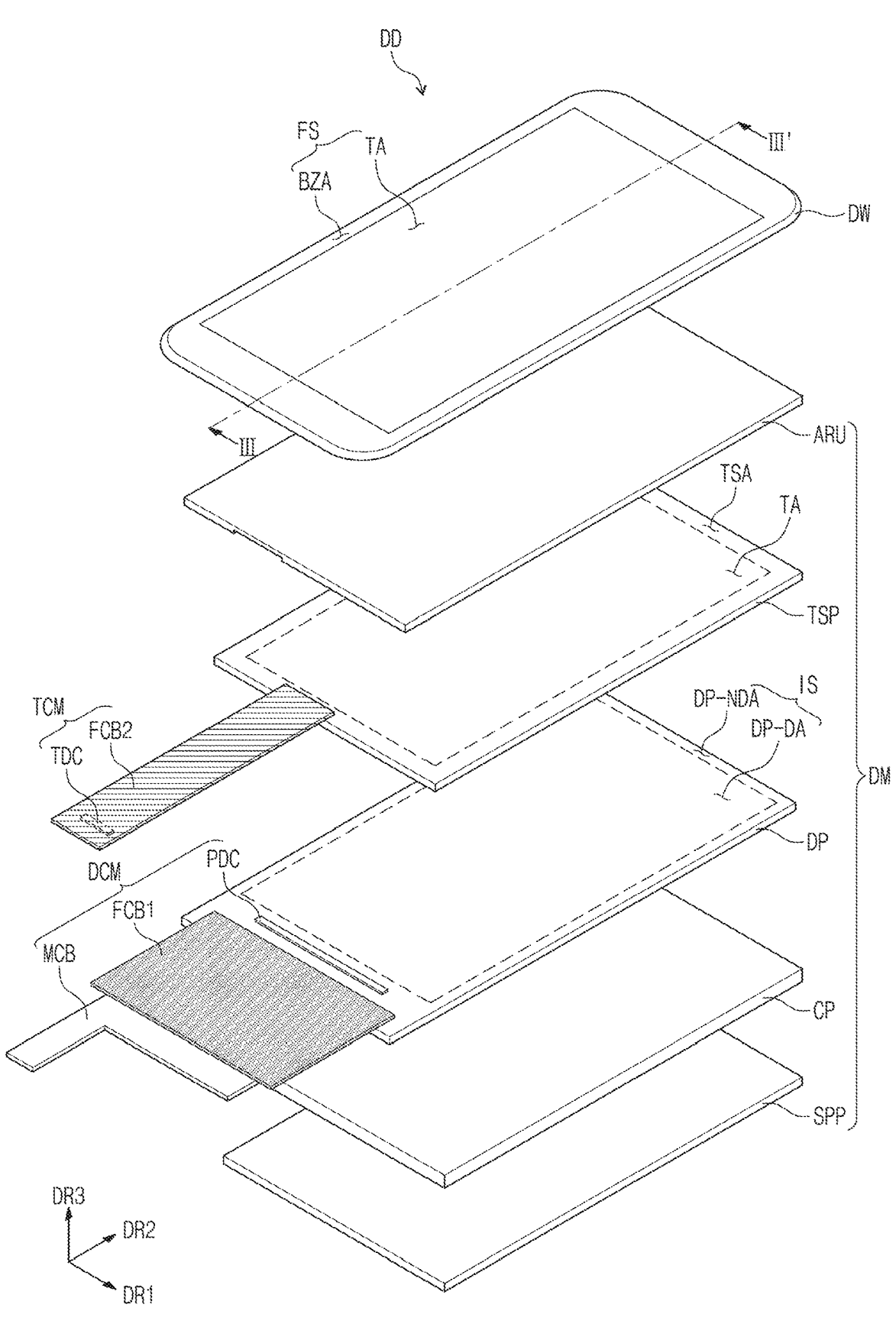
FIG. 6 is an exploded perspective view of a display device, according to an embodiment.

FIG. 6 is an exploded perspective view of a display device DD according to an embodiment.

In FIG. 6, the same reference numerals denote the same elements in FIG. 2, and thus, detailed descriptions of the same elements will be omitted.

In an embodiment and referring to FIG. 6, a display module DM may include a display panel DP and a driving control module DCM connected to the display panel DP. The display panel DP may be rigid without being bent. The driving control module DCM may include a panel driving circuit PDC, a first circuit board FCB1, and a main circuit board MCB. The panel driving circuit PDC may be disposed in a non-display area DP-NDA of the display panel DP by a chip-on-glass (COG) method or a chip-on-plastic (COP) method.

Figure 9A:
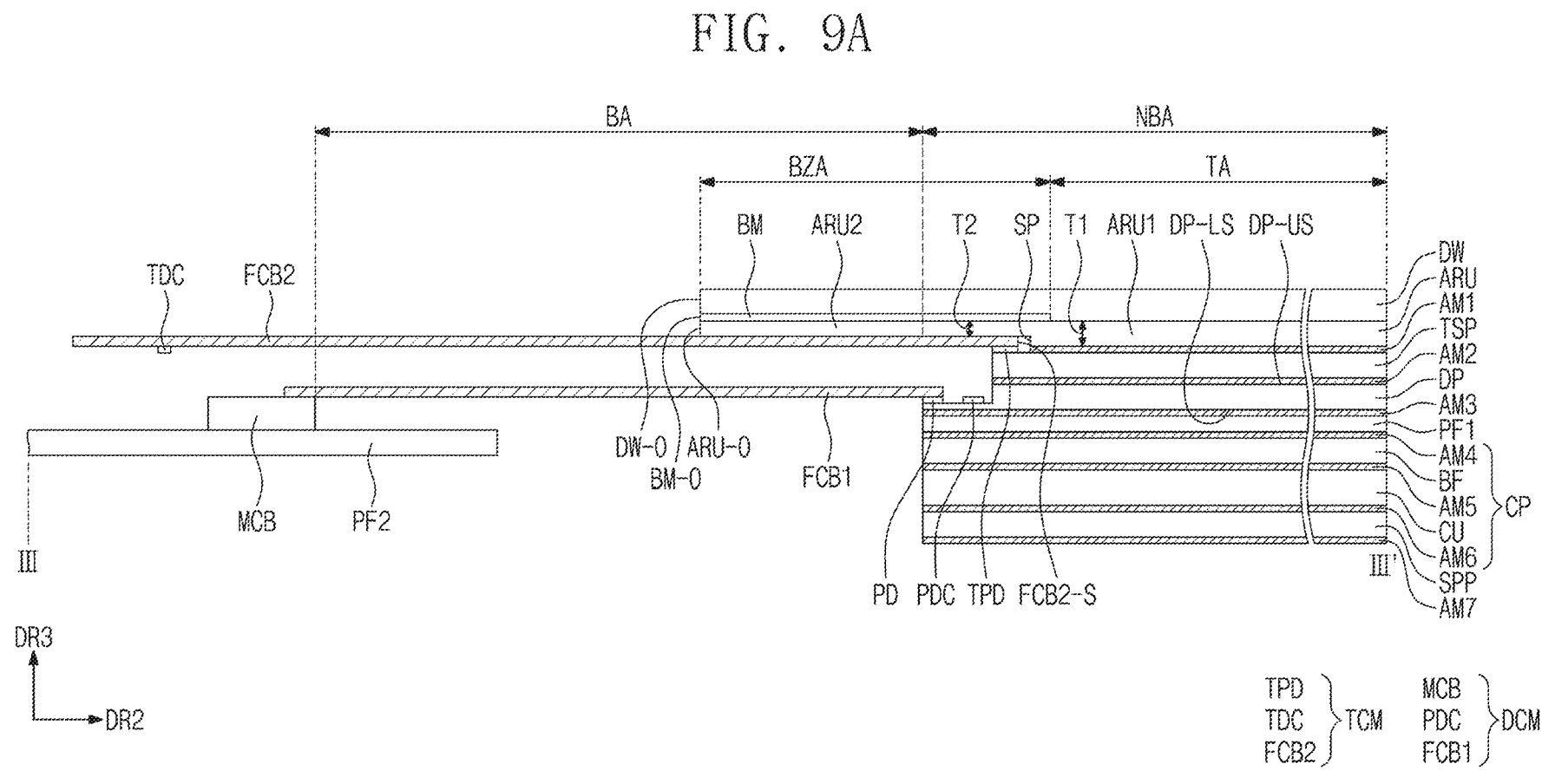
Figure 9B:
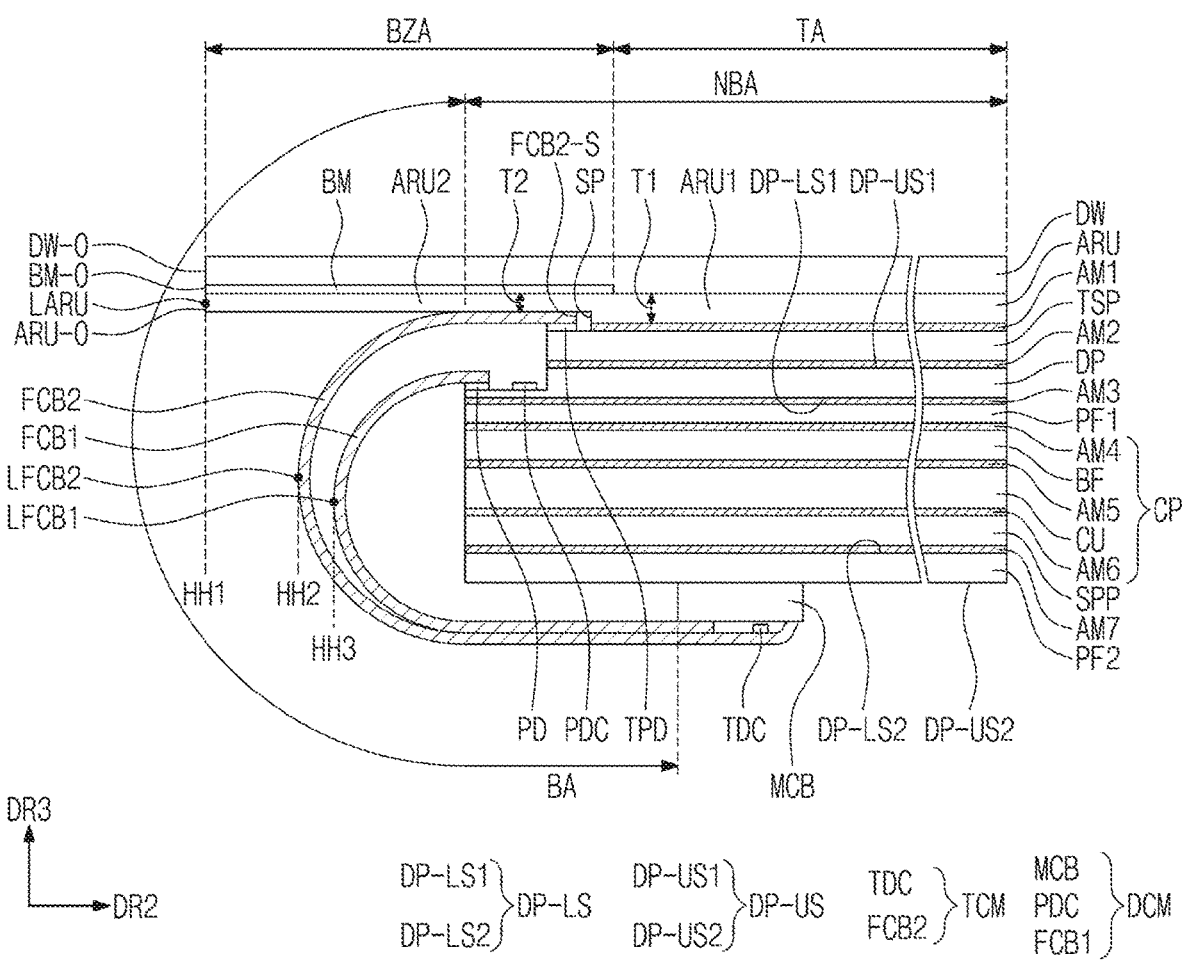
FIG. 9B is a side view of a display device, according to an embodiment.

In an embodiment, the first circuit board FCB1 may be disposed in the non-display area DP-NDA of the display panel DP and may be bent. The first circuit board FCB1 may be connected to an end of the display panel DP and may electrically connect the main circuit board MCB to the display panel DP. As shown in FIG. 9B, the first circuit board FCB1 may be bent, and one end (referred to as "the other end" in the following descriptions with reference to FIG. 9B) of the first circuit board FCB1 may be disposed at a rear side of the display panel DP. The one end (referred to as "the other end" in the following descriptions with reference to FIG. 9B) of the first circuit board FCB1 may be opposite to the rear side of the display panel DP in the non-display area DP-NDA when viewed in the third direction DR3. The main circuit board MCB may be disposed on the rear surface of the display panel DP.

In an embodiment, a touch sensing panel TSP may be disposed between the display panel DP and a polarization unit ARU and may be connected to a second circuit board FCB2. The touch sensing panel TSP may obtain coordinate information of a touch input TC (refer to FIG. 1) generated by a user. The touch sensing panel TSP may sense a variety of inputs applied thereto from the outside of the display device DD. As an example, the touch sensing panel TSP may sense an input generated by a user's body, however, the present invention should not be limited thereto or thereby. For example, the touch sensing panel TSP may sense the external inputs provided in various forms, such as light, heat, and/or pressure. In addition, the touch sensing panel TSP may sense a contact input occurring on a sensing surface thereof and/or a proximity input applied when approaching close to the sensing surface.

In an embodiment, the touch sensing panel TSP may be a capacitive type touch panel and/or an electromagnetic induction type touch panel. The touch sensing panel TSP may include a base layer, sensing electrodes, and/or signal lines connected to the sensing electrodes.

In an embodiment, a touch control unit TCM may include the second circuit board FCB2 and a touch driving circuit TDC. The second circuit board FCB2 may electrically connect the main circuit board MCB to the touch sensing panel TSP, and the touch driving circuit TDC may be mounted on the second circuit board FCB2. The touch driving circuit TDC may be implemented as an integrated circuit. The second circuit board FCB2 may be a flexible circuit board.

Figure 7:
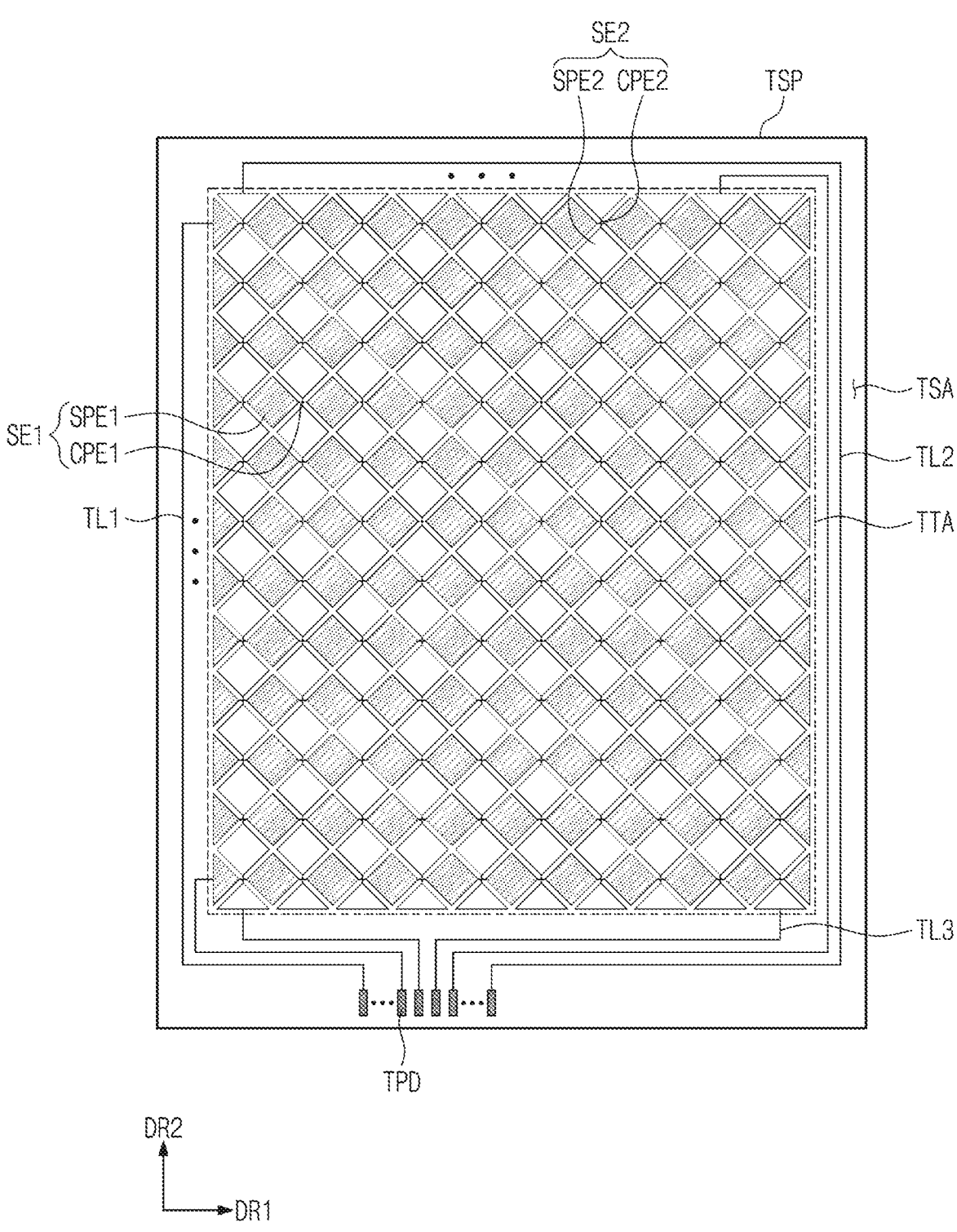
FIG. 7 is a plan view of a touch sensing panel, according to an embodiment.

FIG. 7 is a plan view of the touch sensing panel TSP according to an embodiment.

In an embodiment and referring to FIG. 7, the touch sensing panel TSP may sense the touch input TC (refer to FIG. 1) by the user to obtain information about location and intensity of the external touch input. The touch sensing panel TSP may include a touch area TTA and a touch peripheral area TSA when viewed in the plane. In an embodiment, the touch peripheral area TSA may be defined along an edge of the touch area TTA. The touch area TTA and the touch peripheral area TSA of the touch sensing panel TSP may respectively correspond to the display area DA and the non-display area NDA of the display device DD shown in FIG. 1.

In an embodiment, the touch sensing panel TSP may include a plurality of first sensing electrodes SE1, a plurality of second sensing electrodes SE2, a plurality of sensing lines TL1, TL2, and TL3, and a plurality of sensing pads TPD.

In an embodiment, the first sensing electrodes SE1 and the second sensing electrodes SE2 may be disposed in the touch area TTA. The touch sensing panel TSP may obtain the information about the touch input based on a variation in capacitance between the first sensing electrodes SE1 and the second sensing electrodes SE2.

In an embodiment, the first sensing electrodes SE1 may extend in the first direction DR1 and may be arranged in the second direction DR2. The first sensing electrodes SE1 may include a plurality of first sensing patterns SPE1 and a plurality of first connection patterns CPE1.

In an embodiment, the first sensing patterns SPE1 forming one first sensing electrode may be arranged spaced apart from each other in the first direction DR1. For the convenience of explanation, the first sensing patterns SPE1 is shown shaded. The first connection patterns CPE1 may be disposed between the first sensing patterns SPE1 and may connect two first sensing patterns SPE1 adjacent to each other.

In an embodiment, the second sensing electrodes SE2 may extend in a direction parallel to the second direction DR2 and may be arranged in the first direction DR1. The second sensing electrodes SE2 may include a plurality of second sensing patterns SPE2 and a plurality of second connection patterns CPE2.

In an embodiment, the second sensing patterns SPE2 forming one second sensing electrode may be arranged spaced apart from each other in the second direction DR2. The second connection patterns CPE2 may be disposed between the second sensing patterns SPE2 and may connect two second sensing patterns SPE2 adjacent to each other.

In an embodiment, the sensing lines TL1, TL2, and TL3 may be disposed in the touch peripheral area TSA. The sensing lines TL1, TL2, and TL3 may include first sensing lines TL1, second sensing lines TL2, and third sensing lines TL3. The first sensing lines TL1 may be connected to the first sensing electrodes SEL The second sensing lines TL2 may be connected to one ends of the second sensing electrodes SE2.

In an embodiment, the third sensing lines TL3 may be connected to the other ends of the second sensing electrodes SE2. The other ends of the second sensing electrodes may be opposite to the one ends of the second sensing electrodes SE2. According to an embodiment, the second sensing electrodes SE2 may be connected to the second sensing lines TL2 and the third sensing lines TL3. Accordingly, the second sensing electrodes SE2 having a relatively longer length than that of the first sensing electrodes SE1 may have uniform sensitivity over the entire area thereof. Meanwhile, this is merely an example, and the third sensing lines TL3 may be omitted, and the invention should not be particularly limited.

In an embodiment, the sensing pads TPD may be disposed in the touch peripheral area TSA. The sensing pads TPD may be connected to the sensing lines TL1, TL2, and TL3, respectively, and thus may be electrically connected to each of the first sensing electrodes SE1 and the second sensing electrodes SE2. The sensing pads TPD may be connected to the second circuit board FCB2 (refer to FIG. 8A).

Figure 8A:
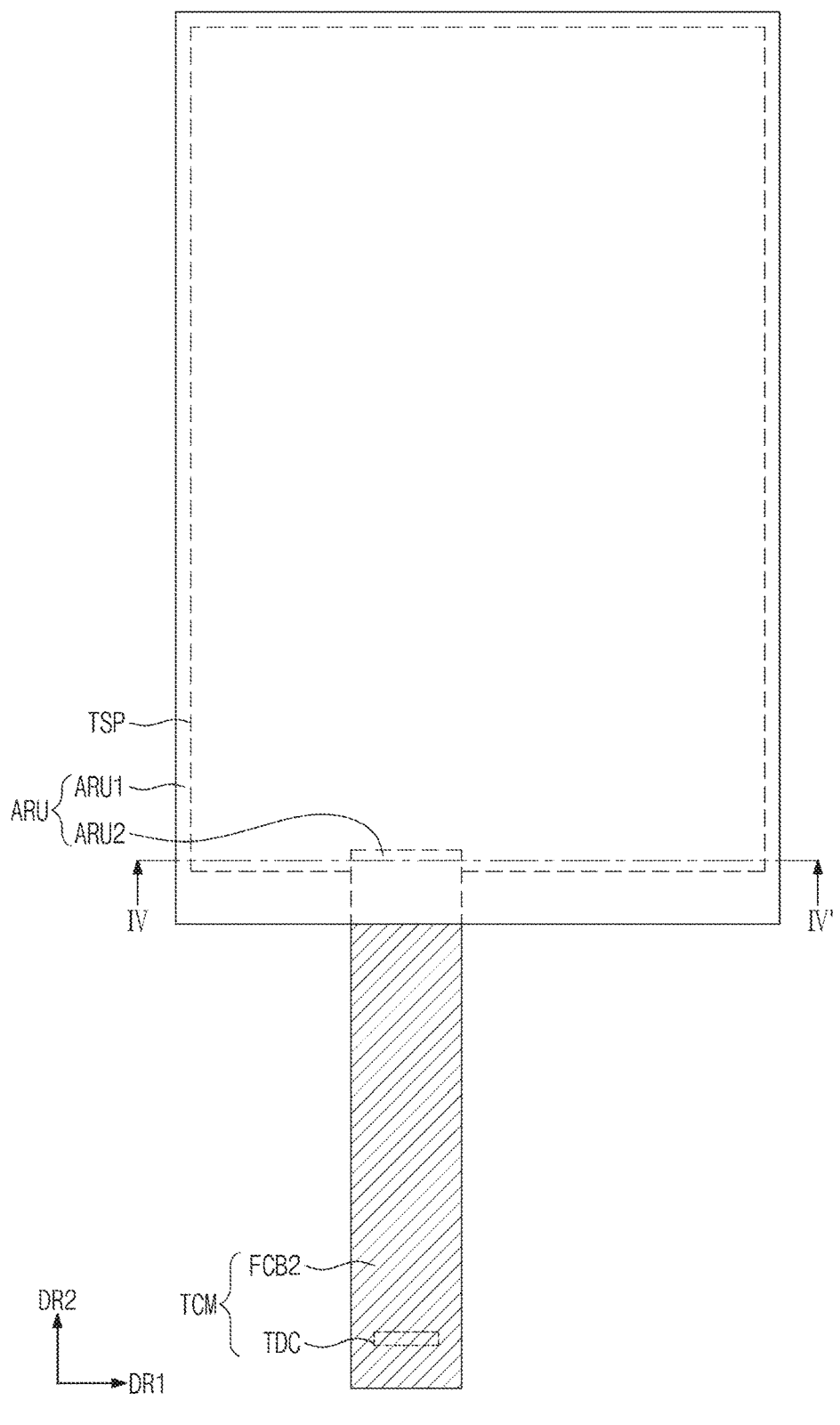
FIG. 8A is a plan view of a polarization unit and a touch control unit, according to an embodiment.

FIG. 8A is a plan view of the polarization unit ARU and the touch control unit TCM according to an embodiment.

In an embodiment and referring to FIG. 8A, the polarization unit ARU may include a first polarization portion ARU1 and a second polarization portion ARU2. In this case, the second polarization portion ARU2 may correspond to the second circuit board FCB2, and the first polarization portion ARU1 may correspond to a remaining portion except the second polarization portion ARU2. The second polarization portion ARU2 may have a shape corresponding to a shape of the second circuit board FCB2 when viewed in the plane. The shape of the second polarization portion ARU2 in the plane may be substantially the same as or may be larger than the shape of the second circuit board FCB2 in the plane. In the present disclosure, the expression "having substantially the same shape" used herein may mean that the shapes will still be considered the same even if there is a slight difference in size, such as a process tolerance.

Figure 8B:
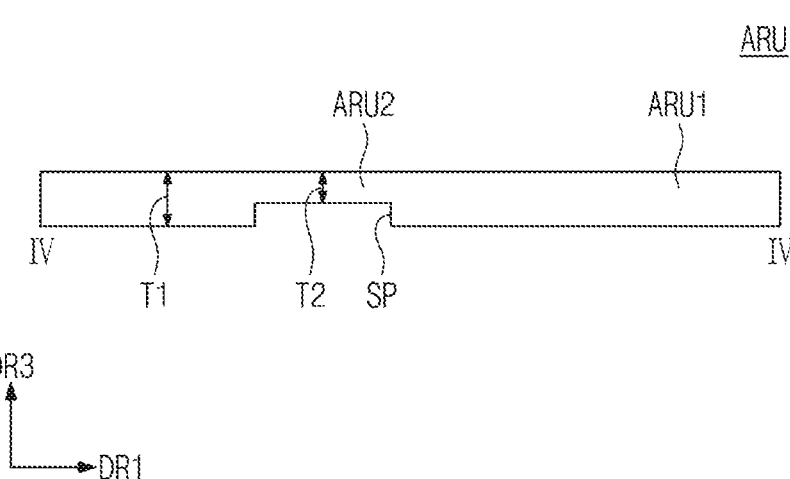
FIG. 8B is a cross-sectional view a polarization unit and a touch control unit taken along a line IV-IV' of FIG. 8A, according to an embodiment.

FIG. 8B is a cross-sectional view taken along a line IV-IV' of FIG. 8A, according to an embodiment.

In an embodiment and referring to FIG. 8B, a step difference SP may exist at a boundary between the first polarization portion ARU1 and the second polarization portion ARU2. The first polarization portion ARU1 may have a thickness T1 that is larger than a thickness T2 of the second polarization portion ARU2. Accordingly, a space may be formed between a lower surface of the second polarization portion ARU2 and an inner side surface of the first polarization portion ARU1. Referring to FIGS. 8A and 8B, the second circuit board FCB2 may be disposed in the space described above.

Therefore, in an embodiment, the polarization unit ARU may extend in a downward direction opposite to the third direction DR3 without contacting the second circuit board FCB2

FIG. 9A is a side view of the display device DD according to an embodiment. FIG. 9B is a side view of the display device DD according to an embodiment. In more detail, FIG. 9A is a cross-sectional view taken along a line III-III' of FIG.

6, and FIG. 9B is a side view illustrating a bent state of a bending area BA of FIG. 9A. In FIGS. 9A and 9B, the same reference numerals denote the same elements in FIG. 5A, and thus, detailed descriptions of the same elements will be omitted.

In an embodiment and referring to FIG. 9A, the display device DD may include the display panel DP, the polarization unit ARU, a first protective film PF1, a second protective film PF2, a protective panel CP, a support panel SPP, the touch sensing panel TSP, a coating window DW, and first, second, third, fourth, fifth, sixth, and seventh adhesive layers AM1, AM2, AM3, AM4, AM5, AM6, and AM7, respectively. Some of the first to seventh adhesive layers AM1 to AM7, respectively, described hereinafter may be omitted.

In an embodiment, the panel driving circuit PDC may be disposed on the display panel DP, however, a position of the panel driving circuit PDC should not be limited thereto or thereby. As an example, the panel driving circuit PDC may be disposed on the first circuit board FCB1. The display panel DP may include a non-bending area NBA that is not bent.

In an embodiment, the first circuit board FCB1 may be electrically connected to the signal pads PD. The signal pads PD may correspond to the signal pads PD disposed in the pad area NDA-PD of FIG. 3. The signal pads PD may be disposed in the non-display area DP-NDA (refer to FIG. 6) of the display panel DP. The first circuit board FCB1 may include a bending area BA that is bent.

In an embodiment, the touch sensing panel TSP may be disposed on the display panel DP and may sense an input signal. The touch sensing panel TSP may be attached to an upper surface DP-US of the display panel DP by the second adhesive layer AM2. However, the second adhesive layer AM2 may be omitted as needed. The touch sensing panel TSP may be disposed between the display panel DP and the polarization unit ARU. The touch sensing panel TSP may be electrically connected to the sensing pad TPD and the second circuit board FCB2.

In an embodiment, the touch control unit TCM may include the touch driving circuit TDC, the second circuit board FCB2, and the sensing pad TPD. The touch control unit TCM may be coupled with an end portion of the touch sensing panel TSP. The second circuit board FCB2 may be connected to the end portion of the touch sensing panel TSP and may electrically connect the main circuit board MCB to the touch sensing panel TSP. The sensing pad TPD may be disposed on the touch sensing panel TSP. In this case, the sensing pad TPD may be the same as the sensing pad TPD shown in FIG. 7.

In an embodiment, the second circuit board FCB2 may be disposed on the display panel DP and may be bent together with the first circuit board FCB1. The second circuit board FCB2 may transmit the input signal sensed by the touch sensing panel TSP. The second circuit board FCB2 may overlap the bending area BA and may overlap a portion of the non-bending area NBA.

In an embodiment, the polarization unit ARU may be disposed on the display panel DP, and a portion of the polarization unit ARU may be disposed on the second circuit board FCB2. A step difference may be defined in the polarization unit ARU to correspond to the second circuit board FCB2. The polarization unit ARU may include the first polarization portion ARU1 and the second polarization portion ARU2.

In an embodiment, the first polarization portion ARU1 may be disposed on the display panel DP and may overlap the non-bending area NBA. The second polarization portion ARU2 may be disposed on the second circuit board FCB2 and may extend from the first polarization portion ARU1 to a direction opposite to the second direction DR2. The second polarization portion ARU2 may overlap the bending area BA and may overlap a portion of the non-bending area NBA.

In an embodiment, the first polarization portion ARU1 may be attached to the touch sensing panel TSP by the first adhesive layer AM1, however, the first adhesive layer AM1 may be omitted as needed. The second polarization portion ARU2 may extend from the first polarization portion ARU1 and may be disposed directly on the second circuit board FCB2 without a separate adhesive layer. This is to prevent the second circuit board FCB2, which is in contact with the second polarization portion ARU2, from causing any disruption to a bending process when the second circuit board FCB2 is bent with the first circuit board FCB1. In a case where the second circuit board FCB2 is attached to the second polarization portion ARU2 by an adhesive layer when the second circuit board FCB2 is bent, a stress may be applied to the second polarization portion ARU2 and the second circuit board FCB2 during the bending operation. As a result, the second circuit board FCB2 or the second polarization portion ARU2 may be damaged.

In an embodiment, the thickness T1 of the first polarization portion ARU1 may be greater than the thickness T2 of the second polarization portion ARU2. The thickness T1 of the first polarization portion ARU1 may be greater than a thickness of the second circuit board FCB2.

In an embodiment, the step difference SP may be defined at the boundary between the first polarization portion ARU1 and the second polarization portion ARU2. The step difference SP may be spaced apart from a side surface FCB2-S of the second circuit board FCB2 by a predetermined distance. A side surface of the first polarization portion ARU1, which defines the step difference SP, may be closer to a center of the non-bending area NBA than the side surface FCB2-S is of the second circuit board FCB2. Accordingly, the side surface FCB2-S of the second circuit board FCB2 and the side surface of the first polarization portion ARU1 may be prevented from colliding with each other during the bending operation.

In an embodiment, the first protective film PF1 may be disposed on the rear surface DP-LS of the display panel DP. The display panel DP and the first protective film PF1 may be attached to each other by the third adhesive layer AM3. The protective panel CP may be disposed on a rear surface of the first protective film PF1. A barrier layer BF may be attached to the rear surface of the first protective film PF1 by the fourth adhesive layer AM4. A cushion layer CU may be attached to a rear surface of the barrier layer BF by the fifth adhesive layer AM5. The support panel SPP may be attached to a rear surface of the cushion layer CU by the sixth adhesive layer AM6.

In an embodiment and referring to FIG. 9B, the first circuit board FCB1 and the second circuit board FCB2 may be bent and may be disposed under the support panel SPP. One surface of the second protective film PF2 may be attached to the seventh adhesive layer AM7.

In an embodiment, the first circuit board FCB1 may be bent. One end of the first circuit board FCB1 may be disposed on a front surface of the display panel DP, and the other end of the first circuit board FCB1 may be disposed at the rear side of the display panel DP. The other end of the first circuit board FCB1 may be connected to the main circuit board MCB.

In an embodiment, the second circuit board FCB2 may be connected to the end portion of the touch sensing panel TSP and may electrically connect the main circuit board MCB to the touch sensing panel TSP. The second circuit board FCB2 may transmit the input signal sensed by the touch sensing panel TSP. The second circuit board FCB2 may be bent together with the first circuit board FCB1. One end of the second circuit board FCB2 may be disposed on a front surface of the touch sensing panel TSP, and the other end of the second circuit board FCB2 may be disposed at a rear side of the touch sensing panel TSP. The other end of the second circuit board FCB2 may be connected to the main circuit board MCB.

In an embodiment, the polarization unit ARU may cover the bent portion of the first circuit board FCB1 and the bent portion of the second circuit board FCB2 when viewed in the plane. Since a light blocking pattern BM is disposed on the polarization unit ARU, the bent portion of the display panel DP may not be viewed from the outside. An outer side surface ARU-O of the polarization unit ARU may protrude outward more than a point LFCB1 of the bent portion of the first circuit board FCB1, which is the most distant from the non-bending area NBA. The outer side surface ARU-O of the polarization unit ARU may protrude outward more than a point LFCB2 of the bent portion of the second circuit board FCB2, which is the most distant from the non-bending area NBA.

In an embodiment, a position in the second direction DR2 of a point LARU of the polarization unit ARU, which is the most distant from the non-bending area NBA, May be defined as a first-first position HH1. A position in the second direction DR2 of the point LFCB2 of the bent portion of the second circuit board FCB2, which is the most distant from the non-bending area NBA, may be defined as a second-first position HH2. A position in the second direction DR2 of the point LFCB1 of the first bent portion of the circuit board FCB1, which is the most distant from the non-bending area NBA, may be defined as a third-first position HH3. The first-first position HH1 may be disposed farther from the non-bending area NBA than the second-first position HH2 and the third-first position HH3. The second-first position HH2 may be disposed farther from the non-bending area NBA than the third-first position HH3.

In an embodiment, the light blocking pattern BM may cover the bent portion of the first circuit board FCB1 and the bent portion of the second circuit board FCB2 when viewed in the plane. An outer side surface BM-O of the light blocking pattern BM may protrude outward more than the point LFCB1 of the bent portion of the first circuit board FCB1, which is the most distant from the non-bending area NBA.

In an embodiment and in the case where the coating window DW is formed by coating a resin material and curing the resin material, it is impossible to attach the light blocking pattern BM to a rear surface of the coating window DW. Accordingly, the light blocking pattern BM may be required to be disposed on an upper surface of the polarization unit ARU disposed under the coating window DW. In the case of a conventional polarization unit ARU in which the polarization unit ARU does not extend to the bending area BA, the light blocking pattern BM also does not extend to the bending area BA. In this case, the bent first circuit board FCB1 and the bent second circuit board FCB2 may be viewed from the outside. According to an embodiment, the step difference may be formed in the polarization unit ARU, and the polarization unit ARU may extend to the bending area BA. Accordingly, the light blocking pattern BM may also extend to the bending area BA, and the bent first circuit board FCB1 and the bent second circuit board FCB2 may not be viewed from the outside.

FIGS. 10A to 10G are side views illustrating a method of manufacturing the display device DD according to an embodiment.

In an embodiment and referring to FIG. 10A, a preliminary display device including the display panel DP, the first protective film PF1, the second protective film PF2, the signal pad PD, the first circuit board FCB1, the panel driving circuit PDC, and the main circuit board MCB may be prepared. Since the detailed structure of the display device DD is previously described with reference to FIGS. 5A and 5B, it will be omitted.

In an embodiment and referring to FIG. 10B, the bending protective layer SNL (or a first member) bent together with the bending area BA (refer to FIG. 5A) may be formed on the display panel DP. The bending protective layer SNL may overlap the bending area BA (refer to FIG. 5A) and may overlap the portion of the non-bending area NBA (refer to FIG. 5A).

Figures 10C, 10D:
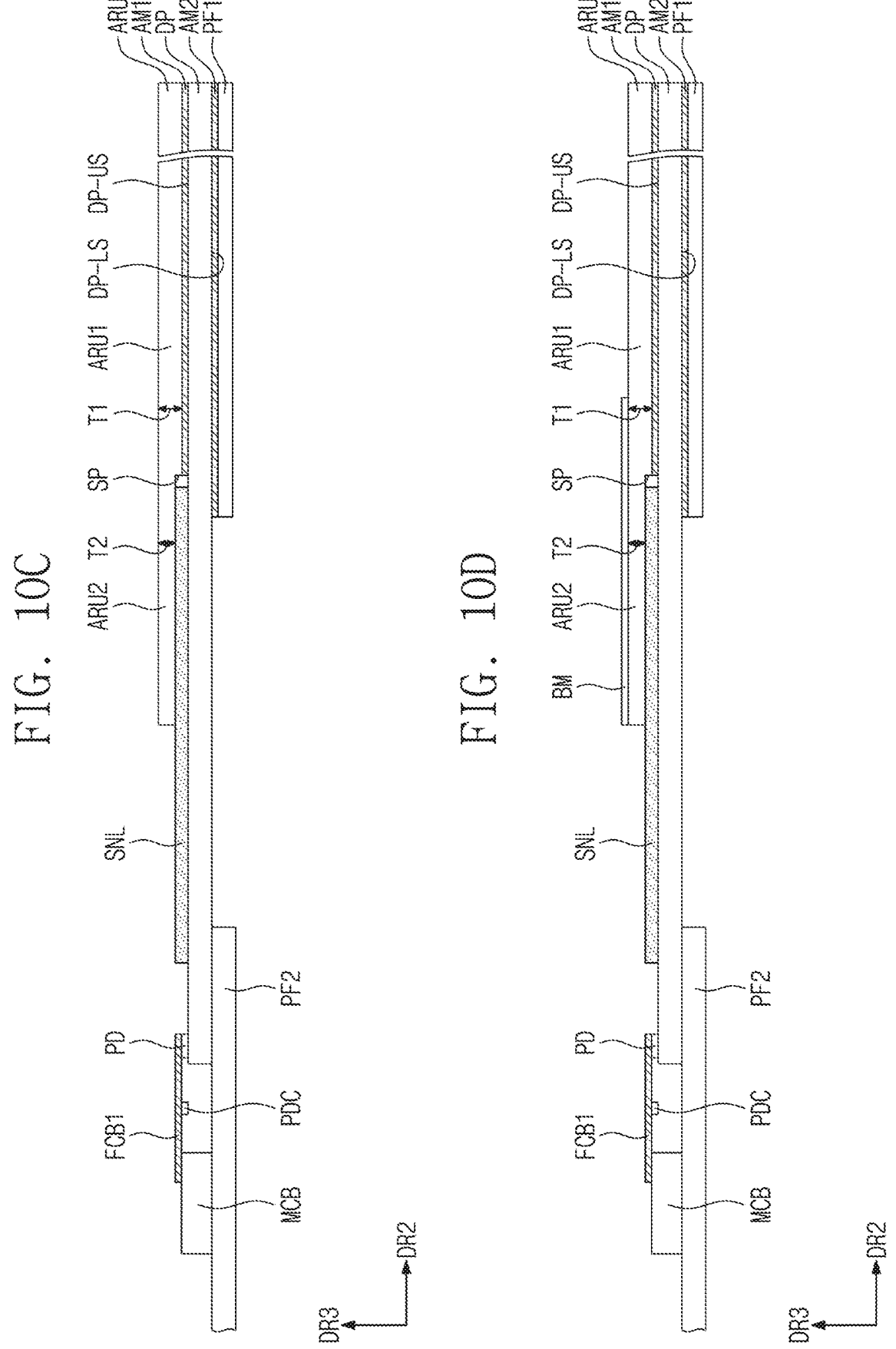
FIG. 10C is a side view of a display device illustrating a method of manufacturing the display device, according to an embodiment.
FIG. 10D is a side view of a display device illustrating a method of manufacturing the display device, according to an embodiment.

In an embodiment and referring to FIG. 10C, the polarization unit ARU in which the step difference corresponding to the bending protective layer SNL is defined may be formed on the display panel DP and the bending protective layer SNL. The polarization unit ARU may be the polarization plate or the polarization film and may be formed on the display panel DP through a lamination process. The step difference SP of the polarization unit ARU may be formed by forming a preliminary polarization unit having a flat shape using a conventional process and etching the preliminary polarization unit to have the shape corresponding to the bending protective layer SNL.

In an embodiment and referring to FIG. 10D, the light blocking pattern BM may be formed on the polarization unit ARU and may overlap the bending area BA (refer to FIG. 5A). The light blocking pattern BM may be coated on the polarization unit ARU to allow the outer side surface thereof to be aligned with the outer side surface of the polarization unit ARU.

Figure 10E:
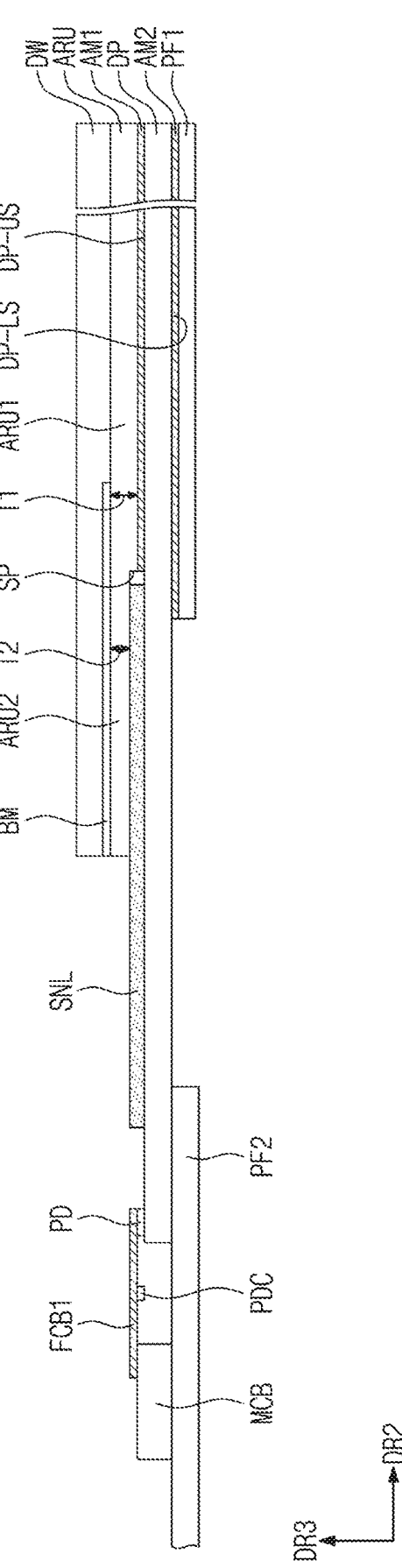
FIG. 10E is a side view of a display device illustrating a method of manufacturing the display device, according to an embodiment.

In an embodiment and referring to FIG. 10E, the coating window DW including the resin material may be formed on the polarization unit ARU. The coating window DW may be formed by coating a coating solution including the resin material on the polarization unit ARU and curing the coated coating solution. Since the polarization unit ARU extends to the bending area BA, the coated coating solution may not enter the bending protective layer SNL or the display panel DP, which is to be bent. Accordingly, the coating solution, which is cured after entering into the bending protective layer SNL or the display panel DP, may be prevented from causing any disruption to the bending process.

In an embodiment and in the case where the coating window DW is formed as described above, a cost of the display device may be reduced compared with a case of using a conventional glass-type window. In addition, a separate lamination process and a process of forming the optically clear adhesive (OCA) may be omitted. Thus, a manufacturing process of the display device may be simplified, and a process reliability of the display device may be improved.

Figure 10F:
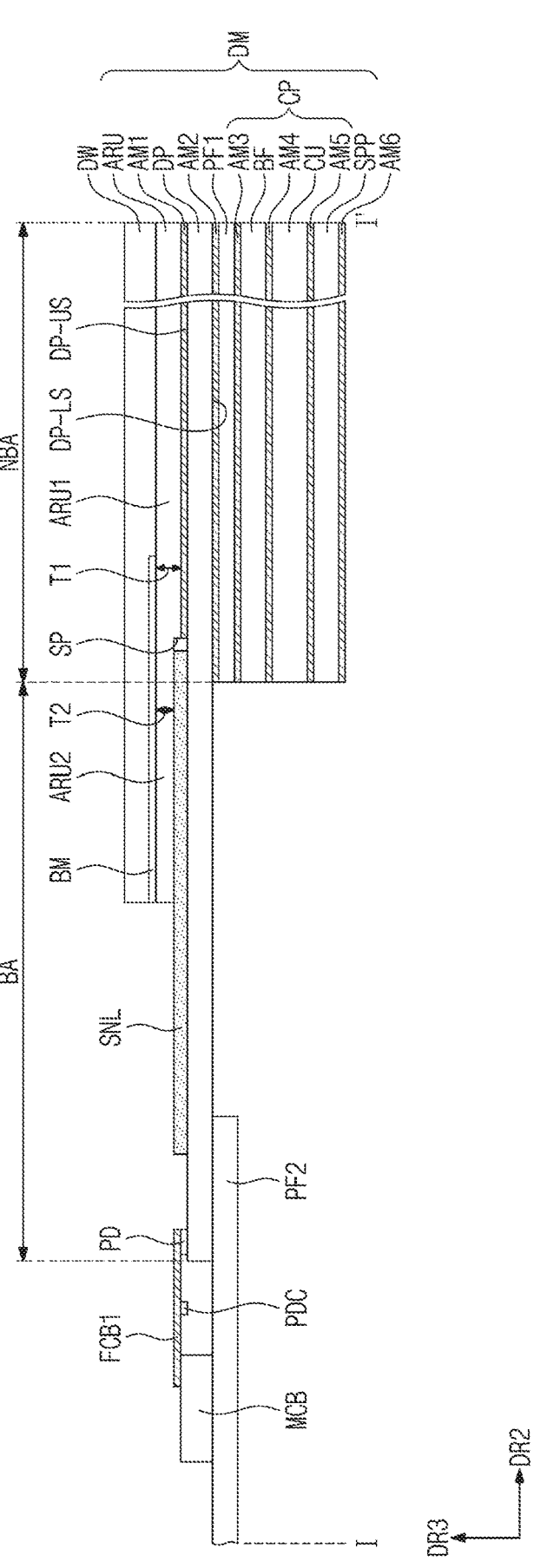
FIG. 10F is a side view of a display device illustrating a method of manufacturing the display device, according to an embodiment.
Figure 10G:
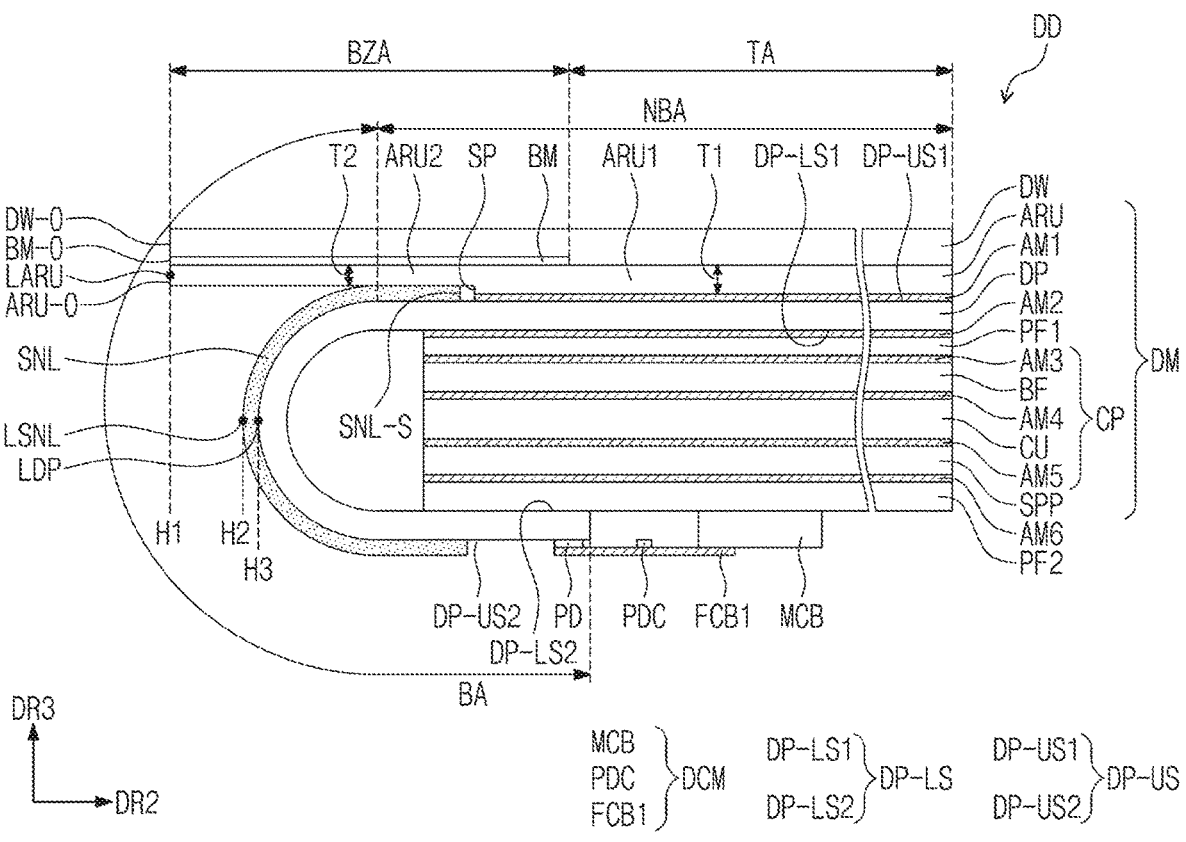
FIG. 10G is a side view of a display device illustrating a method of manufacturing the display device, according to an embodiment.

In an embodiment and referring to FIGS. 10F and 10G, the protective panel CP and the support panel SPP may be formed under the first protective film PF1. Then, the bending area BA of the display panel DP and the bending protective layer SNL may be bent. When the display panel DP is bent, the second protective film PF2 may be attached to a lower surface of the support panel SPP by the sixth adhesive layer AM6.

FIGS. 11A to 11H are side views illustrating a method of manufacturing the display device DD according to an embodiment.

In an embodiment and referring to FIG. 11A, a preliminary display device including the display panel DP, the first protective film PF1, the second protective film PF2, the signal pad PD, the first circuit board FCB1, the panel driving circuit PDC, and the main circuit board MCB may be prepared. Since the detailed structure of the display device DD is previously described with reference to FIGS. 9A and 9B, it will be omitted.

Figure 11C:
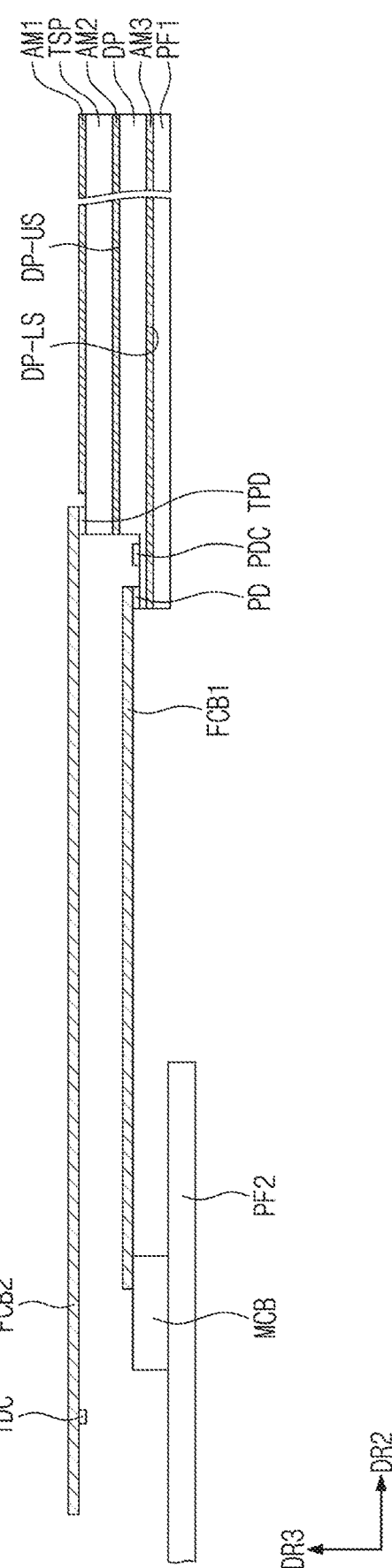
FIG. 11C is a side view of a display device illustrating a method of manufacturing the display device, according to an embodiment.

In an embodiment and referring to FIGS. 11B and 11C, the touch sensing panel TSP may be formed on the display panel DP. After the touch sensing panel TSP is formed, the second circuit board (or a first member) FCB2 bent together with the first circuit board FCB1 may be formed. The second circuit board FCB2 may overlap the bending area BA (refer to FIG. 9A) and may overlap the portion of the non-bending area NBA (refer to FIG. 9A). The sensing pad TPD may be formed at one end portion of the second circuit board FCB2. The touch driving circuit TDC may be formed at the other end portion of the second circuit board FCB2.

Figure 11D:
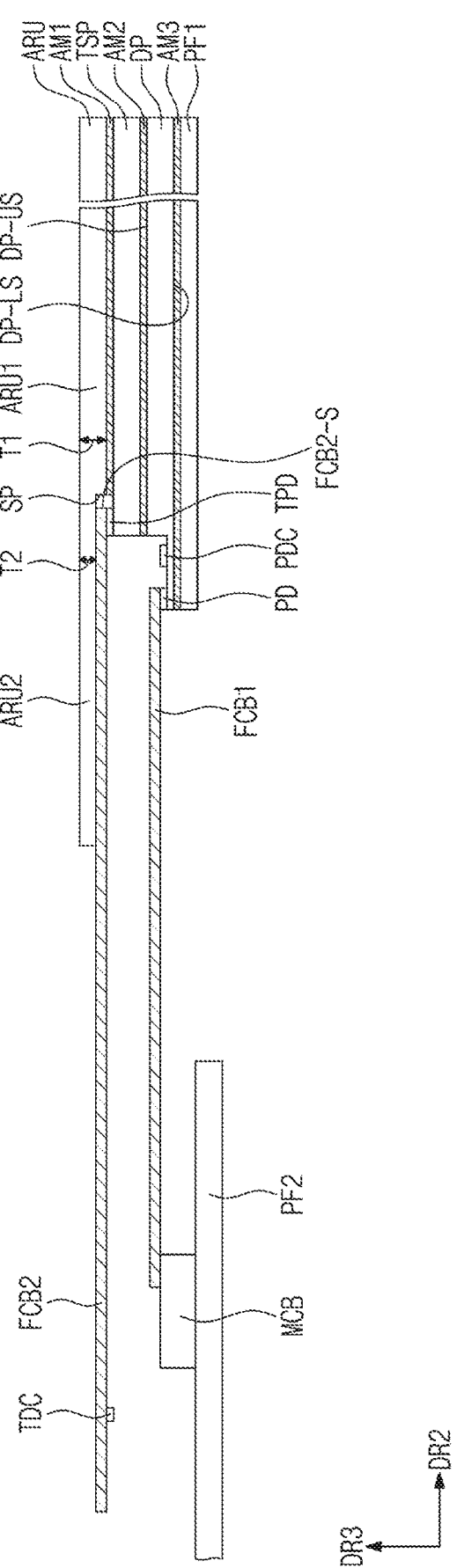
FIG. 11D is a side view of a display device illustrating a method of manufacturing the display device, according to an embodiment.

In an embodiment and referring to FIG. 11D, the polarization unit ARU in which the step difference corresponding to the second circuit board FCB2 is defined may be formed on the touch sensing panel TSP and the second circuit board FCB2. The polarization unit ARU may be the polarization plate or the polarization film and may be formed on the display panel DP through a lamination process. The step difference SP of the polarization unit ARU may be formed by forming a preliminary polarization unit having a flat shape using a conventional process and etching the preliminary polarization unit to have the shape corresponding to the second circuit board FCB2.

Figure 11E:
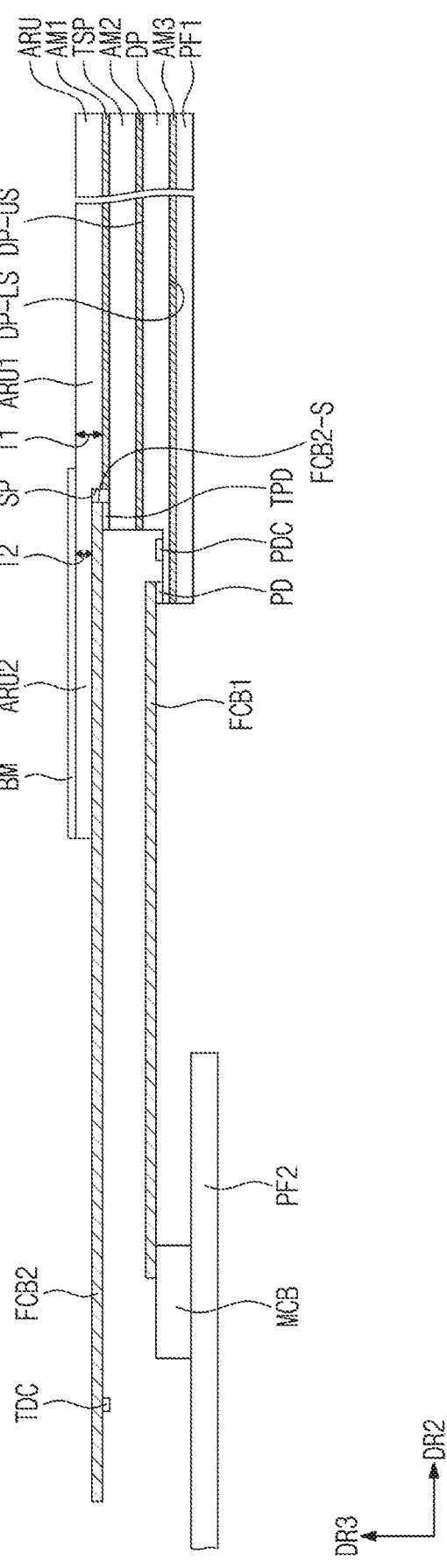
FIG. 11E is a side view of a display device illustrating a method of manufacturing the display device, according to an embodiment.

In an embodiment and referring to FIG. 11E, the light blocking pattern BM may be formed on the polarization unit ARU and may overlap a portion of the first circuit board FCB1 (refer to FIG. 9B), which is to be bent. The light blocking pattern BM may be coated on the polarization unit ARU to allow the outer side surface thereof to be aligned with the outer side surface of the polarization unit ARU.

Figure 11F:
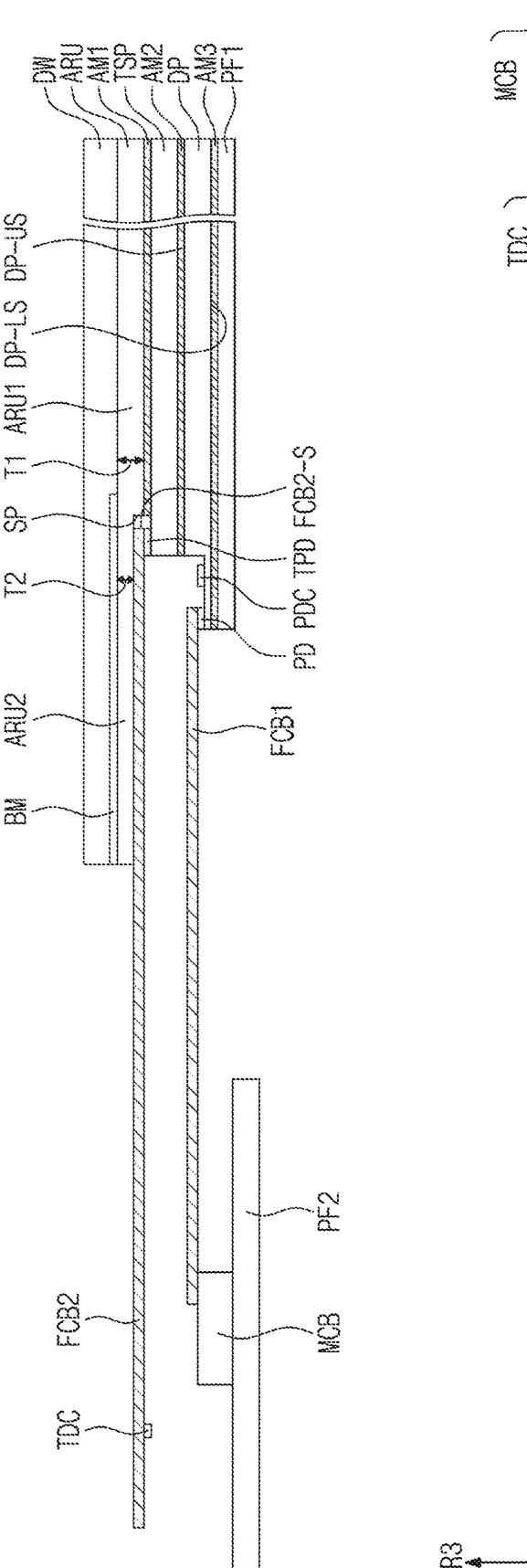
FIG. 11F is a side view of a display device illustrating a method of manufacturing the display device, according to an embodiment.

In an embodiment and referring to FIG. 11F, the coating window DW including the resin material may be formed on the polarization unit ARU. The coating window DW may be formed by coating a coating solution including the resin material on the polarization unit ARU and curing the coated coating solution. Since the polarization unit ARU extends to the bending area BA, the coated coating solution may not enter the second circuit board FCB2 or the display panel DP, which is to be bent. Accordingly, the coating solution, which is cured after entering into the second circuit board FCB2 or the display panel DP, may be prevented from causing any disruption to the bending process.

Figure 11G:
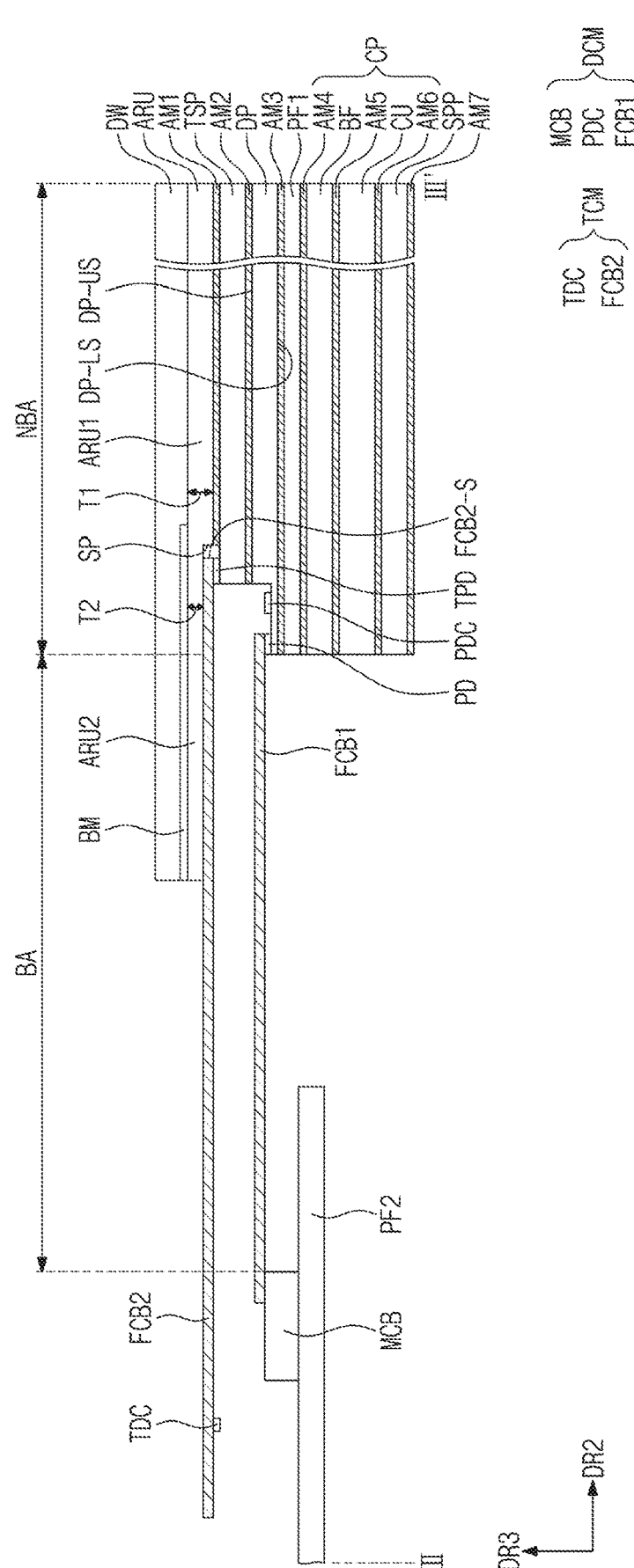
FIG. 11G is a side view of a display device illustrating a method of manufacturing the display device, according to an embodiment.
Figure 11H:
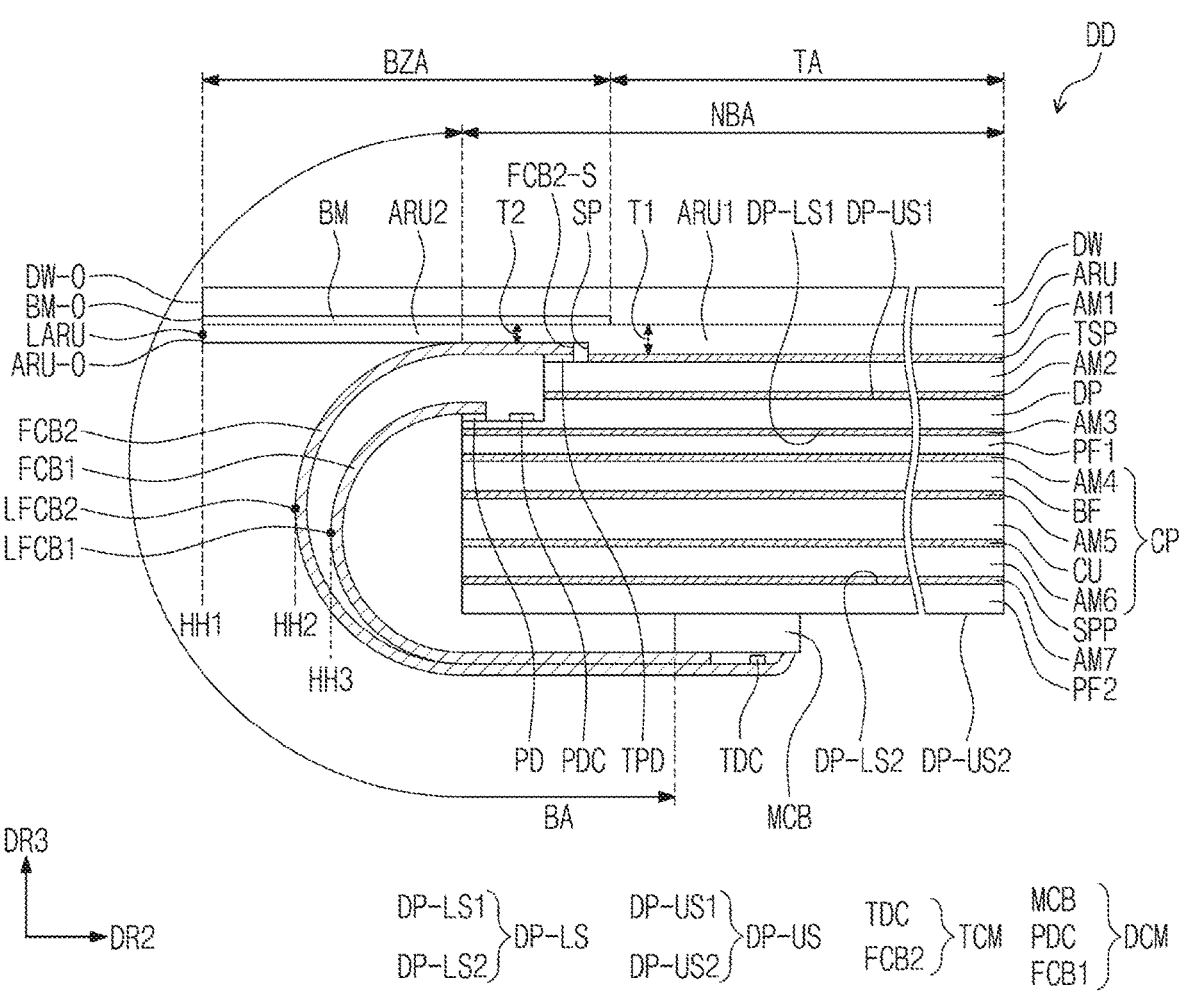
FIG. 11H is a side view of a display device illustrating a method of manufacturing the display device, according to an embodiment.

In an embodiment and referring to FIGS. 11G and 11H, the protective panel CP and the support panel SPP may be formed under the first protective film PF1. Then, the first circuit board FCB1 and the second circuit board FCB2 may be bent. When the first circuit board FCB1 and the second circuit board FCB2 are bent, the second protective film PF2 may be attached to the lower surface of the support panel SPP by the seventh adhesive layer AM7. The other end portion of the second circuit board FCB2 may be connected to the main circuit board MCB.

Although the embodiments of the present disclosure have been described, it is understood that the invention should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the invention shall be determined according to the attached claims.

What is claimed is:

1. A display device comprising:
a display panel comprising a non-bending area and a bending area extending from an end of the non-bending area, wherein the display panel includes a display panel bendable portion;
a bending protective layer disposed on the display panel and including a bending protective layer bendable portion being bendable with the bending area;
a polarization unit disposed on the display panel, partially disposed on the bending protective layer, and defining a step difference which corresponds to the bending protective layer; and
a coating window disposed directly on the polarization unit and comprising a resin material, wherein the polarization unit overlaps the bending area and the non-bending area, and wherein the polarization unit covers the display panel bendable portion.

2. The display device of claim 1, wherein an outer side surface of the polarization unit is disposed at a same position as a point of the bending protective layer bendable portion, which is disposed at a most distant point from the non-bending area.

3. The display device of claim 1, wherein an outer side surface of the polarization unit protrudes outward more than the display panel bendable portion, which is disposed a most distant point from the non-bending area.

4. The display device of claim 1, wherein the polarization unit comprises:
a first polarization portion disposed on the display panel and overlapping the non-bending area; and
a second polarization portion disposed on the bending protective layer, extending from the first polarization portion, and overlapping the non-bending area, wherein the step difference is located at a boundary between the first polarization portion and second polarization portion.

5. The display device of claim 4, wherein the first polarization portion has a thickness greater than a thickness of the second polarization portion.

6. The display device of claim 4, wherein the second polarization portion is disposed directly on the bending protective layer.

7. The display device of claim 4, wherein the second polarization portion has a planar shape corresponding to a planar shape of the bending protective layer.

8. The display device of claim 1, further comprising a light blocking pattern disposed directly on the polarization unit and covering the display panel bendable portion and the bending protective layer bendable portion.

9. The display device of claim 8, wherein an outer side surface of the light blocking pattern protrudes outwardly more than the display panel bendable portion, which is disposed at a most distant point from the non-bending area.

10. The display device of claim 8, wherein an outer side surface of the light blocking pattern and an outer side surface of the coating window are aligned with an outer side surface of the polarization unit.

11. The display device of claim 1, wherein an outer side surface of the polarization unit protrudes outwardly more than the bending protective layer bendable portion, which is disposed at a most distant point from the non-bending area.

12. The display device of claim 1, further comprising:
a main circuit board that is a rigid circuit board or a flexible circuit board; and
a first circuit board connected to an end portion of the display panel and electrically connecting the main circuit board and the display panel.

13. The display device of claim 1, wherein the step difference is spaced apart from a side surface of the bending protective layer.

14. A display device comprising:
a display panel comprising a display area and a non-display area surrounding the display area;
a first circuit board overlapping the non-display area and comprising one end disposed on a front surface of the display panel and the other end disposed at a rear side of the display panel;
a polarization unit disposed on the display panel and the first circuit board and defining a step difference which corresponds to the first circuit board; and
a coating window disposed directly on the polarization unit and comprising a resin material, wherein the polarization unit covers a first circuit board bendable portion.

15. The display device of claim 14, wherein an outer side surface of the polarization unit protrudes outwardly more than the first circuit board bendable portion, which is disposed at a most distant point from a non-bending area.

16. The display device of claim 14, wherein the polarization unit comprises:
a first polarization portion disposed on the display panel and having a first thickness; and a second polarization portion extending from the first polarization portion, having a second thickness smaller than the first thickness, and overlapping the first circuit board bendable portion, wherein the step difference is located at a boundary between the first polarization portion and the second polarization portion.

17. The display device of claim 14, further comprising:
a touch sensing panel disposed between the display panel and the polarization unit, wherein the touch sensing panel is connected to the first circuit board, and senses an input signal; and
a main circuit board electrically connected to the touch sensing panel by the first circuit board.

18. The display device of claim 14, further comprising a light blocking pattern disposed directly on the polarization unit and covering the first circuit board bendable portion.

19. A method of manufacturing a display device, comprising:
forming a first member on a display panel, wherein the first member includes a first member bendable portion, and wherein the display panel comprises a display area and a non-display area surrounding the display area;
forming a polarization unit in which a step difference corresponding to the first member is defined on the display panel and the first member;
forming a light blocking pattern on the polarization unit to overlap the first member bendable portion;
forming a coating window comprising a resin material on the polarization unit; and
bending the first member, wherein the polarization unit covers the first member bendable portion.

20. The method of claim 19, wherein the forming of the coating window comprises:
coating the resin material on the polarization unit; and
curing the coated resin material.

* * * * *